United States Patent
Okabayashi et al.

[11] Patent Number: 6,015,081
[45] Date of Patent: *Jan. 18, 2000

[54] ELECTRICAL CONNECTIONS USING DEFORMING COMPRESSION

[75] Inventors: Takahiro Okabayashi, Tokyo; Tetsuo Yoshizawa, Yokohama; Toyohide Miyazaki, Ibaraki-ken; Hiroshi Kondo, Yokohama; Yoshimi Terayama, Odawara; Takashi Sakaki, Tokyo; Yuichi Ikegami, Osaka; Kazuo Kondo, Tokyo; Yoichi Tamura, Tokyo; Yasuo Nakatsuka, Tokyo, all of Japan

[73] Assignees: Canon Kabushiki Kaisha; Sumitomo Metal Industries, Ltd., both of Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/206,270

[22] Filed: Mar. 7, 1994

Related U.S. Application Data

[63] Continuation of application No. 07/841,016, Feb. 25, 1992, abandoned.

[30] Foreign Application Priority Data

| Feb. 25, 1991 | [JP] | Japan | 3-53903 |
| Mar. 9, 1991 | [JP] | Japan | 3-69089 |
| Mar. 27, 1991 | [JP] | Japan | 3-89826 |
| Mar. 27, 1991 | [JP] | Japan | 3-89827 |
| May 21, 1991 | [JP] | Japan | 3-146944 |

[51] Int. Cl.[7] ............................................. B23K 31/02
[52] U.S. Cl. ............................... 228/180.22; 228/235.1
[58] Field of Search ........................... 439/66, 67, 91, 439/40; 156/580, 581, 582, 583.1, 583.5, 306.6; 29/830; 100/917; 228/180.22, 180.21, 235.1

[56] References Cited

U.S. PATENT DOCUMENTS

| 2,614,590 | 10/1952 | Hervey | 100/917 |
| 2,713,379 | 7/1955 | Sisson | 100/917 |
| 3,119,922 | 1/1964 | Mayhew | 156/581 |

(List continued on next page.)

FOREIGN PATENT DOCUMENTS

| 0055640 | 7/1982 | European Pat. Off. . |
| 0152189 | 8/1985 | European Pat. Off. . |
| 0219408 | 4/1987 | European Pat. Off. . |
| 0262580 | 4/1988 | European Pat. Off. . |
| 0339275 | 11/1989 | European Pat. Off. . |
| 0368262 | 5/1990 | European Pat. Off. . |
| 42-2096 | 1/1967 | Japan . |
| 84139636 | 8/1984 | Japan . |
| 60-057944 | 4/1985 | Japan . |
| 60-216411 | 10/1985 | Japan . |

(List continued on next page.)

OTHER PUBLICATIONS

L.S.Goldmann, "Geometric Optimization of Controlled Collapse Inter-coonections", IBM Journal of Research and Development, Index vol. 13, pp. 251–265 (May 1969).

K.D. Norris, et al., "Reliability of Controlled Collapse Inter-connections," IBM Journal of Research and Development, Index vol. 13, pp. 266–271 (May 1969).

IBM Technical Disclosure, vol. 33, No. 6B, p. 130, Nov. 1990.

*Primary Examiner*—Neil Abrams
*Attorney, Agent, or Firm*—Fitzpatrick, Cella, Harper & Scinto

[57] ABSTRACT

A method for the electrical connection between electrical joints of electric circuit components includes disposing said electric circuit components so that said joints for the electrical connection are opposed to each other, and making the electrical connection between said electrical joints with a biasing force which is exerted by an elastic member from at least one side of said electric circuit component so that the biasing force is exerted consecutively from an intermediate position of connecting area where said joints are located to the periphery of said connecting area.

4 Claims, 17 Drawing Sheets

U.S. PATENT DOCUMENTS

| | | | |
|---|---|---|---|
| 3,680,037 | 7/1972 | Nellis et al. | 439/591 |
| 3,870,582 | 3/1975 | Brackett et al. | 156/581 |
| 3,901,758 | 8/1975 | Humphries | 156/583.1 |
| 3,972,766 | 8/1976 | Fontrielle | 156/580 |
| 4,050,756 | 9/1977 | Moore | 29/845 |
| 4,234,373 | 11/1980 | Reavill et al. | 156/580 |
| 4,263,606 | 4/1981 | Yorikane | 357/71 |
| 4,445,735 | 5/1984 | Bonnefoy | 439/592 |
| 4,509,099 | 4/1985 | Takamatsu et al. | 439/65 |
| 4,545,838 | 10/1985 | Minkus et al. | 156/230 |
| 4,611,869 | 9/1986 | Bonnefoy | 439/373 |
| 4,664,309 | 5/1987 | Allen et al. | 228/180.22 |
| 4,729,809 | 3/1988 | Dery et al. | 156/306.6 |
| 4,754,546 | 7/1988 | Lee et al. | 29/877 |
| 4,814,040 | 3/1989 | Ozawa | 156/634 |
| 4,926,549 | 5/1990 | Yohizawa et al. | 29/876 |
| 4,927,479 | 5/1990 | Bock | 156/583.1 |
| 4,975,637 | 12/1990 | Frankeny | 324/158 |
| 5,039,371 | 8/1991 | Cremens et al. | 156/583.1 |
| 5,058,800 | 10/1991 | Yoshizawa et al. | 228/181 |

FOREIGN PATENT DOCUMENTS

| | | |
|---|---|---|
| 61-78069 | 4/1986 | Japan . |
| 61166876 | 7/1986 | Japan . |
| 61-174643 | 8/1986 | Japan . |
| 63-222437 | 9/1988 | Japan . |
| 63-224235 | 9/1988 | Japan . |
| 63-228726 | 9/1988 | Japan . |
| 63-246835 | 10/1988 | Japan . |
| 1044095 | 6/1989 | Japan . |
| 1316674 | 12/1989 | Japan . |
| 0249385 | 2/1990 | Japan . |

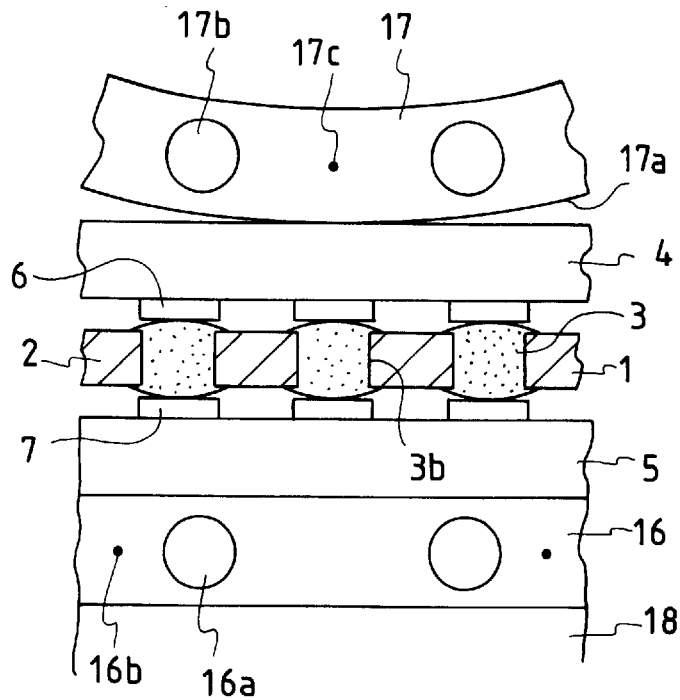
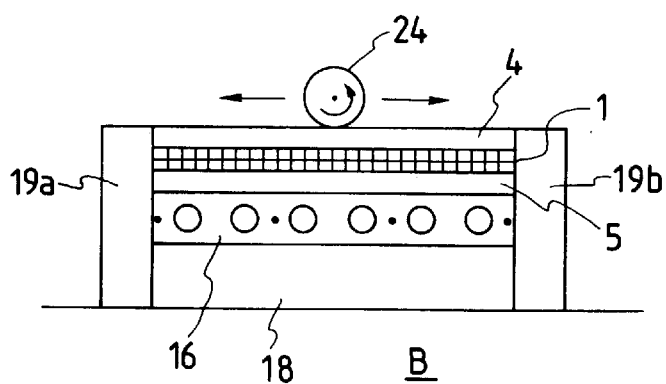
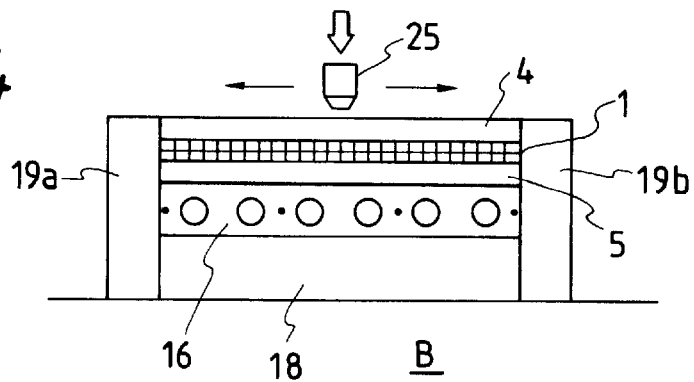

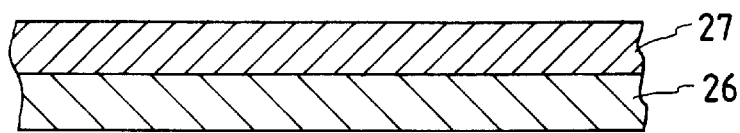
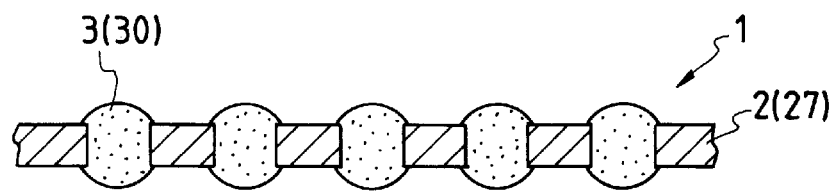
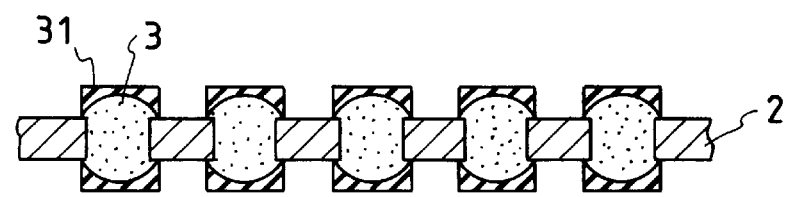
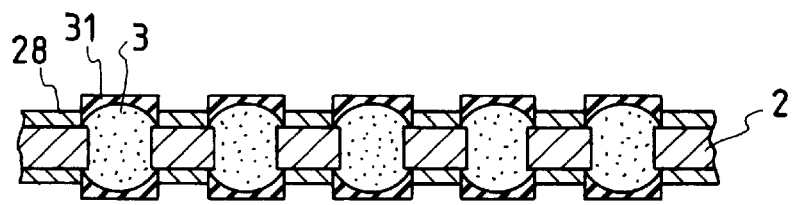
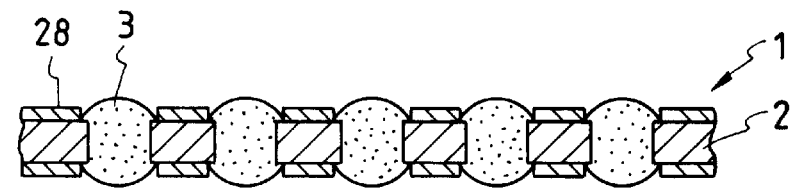

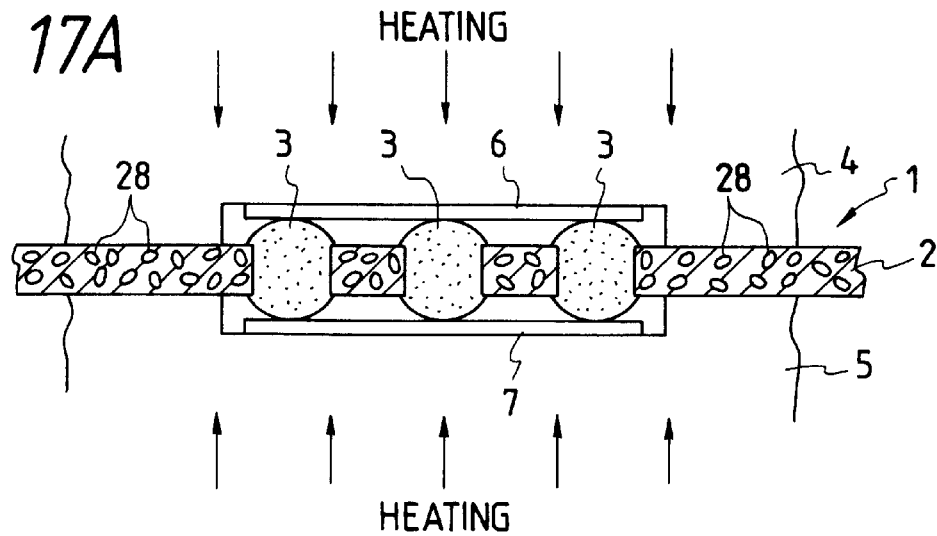
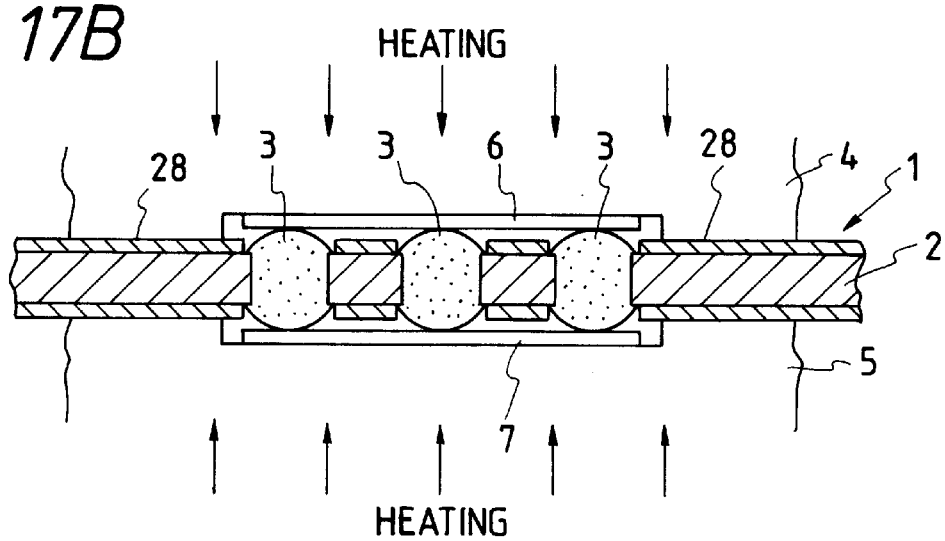
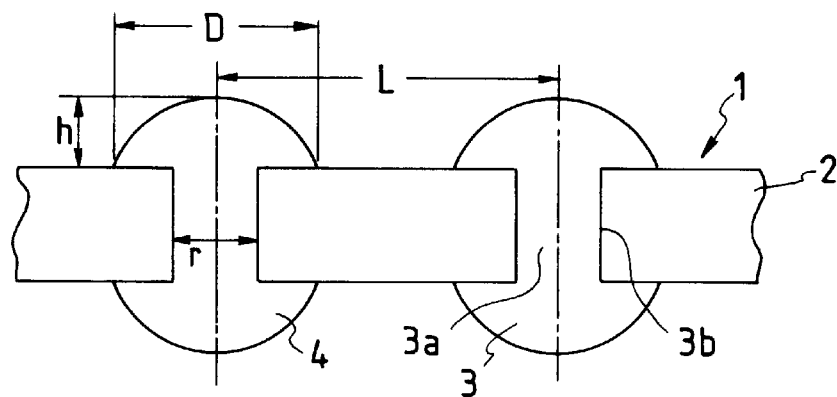

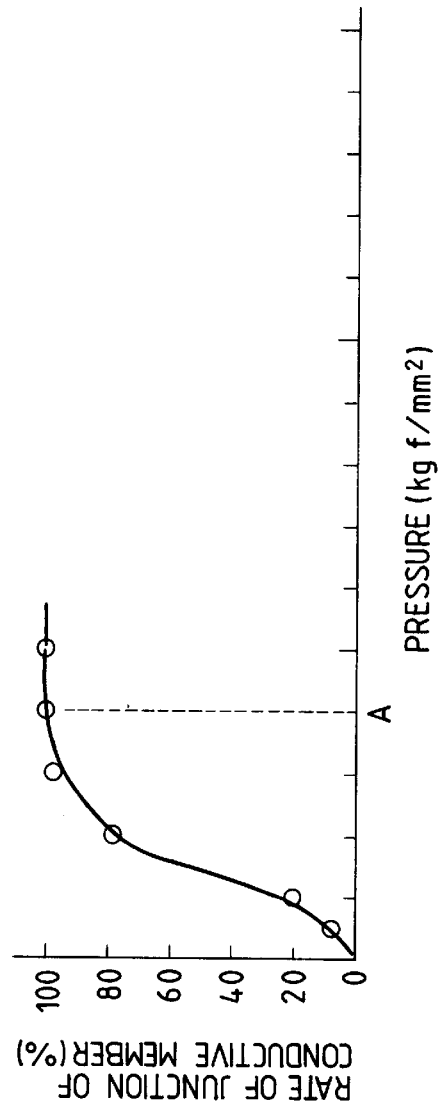
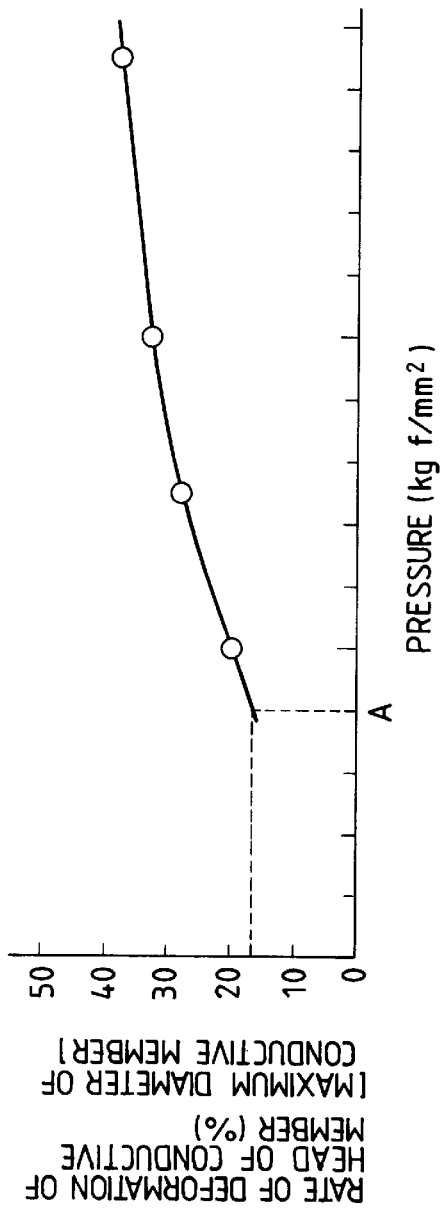
FIG. 19A
FIG. 19B

ELECTRICAL CONNECTIONS USING DEFORMING COMPRESSION

This application is a continuation of application Ser. No. 07/841,016 filed Feb. 25, 1992, now abandoned.

BACKGROUND OF THE INVENTION

1. Field of the Invention

The present invention relates to an electrical connecting member for allowing the electrical connection between electric circuit components such as printed boards in a secure manner, a connecting method for the electric circuit components using that connecting member, and an apparatus therefore.

2. Related Background Art

The methods for obtaining the electrical connecting state between electric circuit components include a wire bonding method, an automatic bonding method based on a tape carrier method as disclosed in Japanese Patent Application Laid-Open No. 59-139636, and a so-called TAB (Tape Automated Bonding) method.

However, these methods had the difficulty that they were all expensive, there were a number of connecting components between electric circuit components, and it was not possible to cope with a high density of electrical joints.

Also, there was a problem that the connecting state could not be obtained collectively between a number of joints, resulting in requiring considerable time for connecting operation and a limited reduction of the cost.

To resolve these difficulties, there is known a method for the electrical connection between electric circuit components in which, for example, electrical joints are formed on a printed board slightly projected from the surface of the printed board, and both electrical joints are bonded together under pressure directly or indirectly with the interposition of a conductive member as the electrical connecting member between both electrical joints, so that the electric circuit components which are printed boards can be electrically connected.

Among the connecting methods for such electric circuit components, is the method shown in FIG. 24. FIG. 24 is a half-size view illustrating a conventional connecting form between electric circuit components, in which 21, 22 are long size substrates which are electric circuit components such as printed boards, and 23, 24 are pressing members. Each substrate 21, 22 of electric circuit component has printed wiring disposed on its surface, or electrical joints 21a, 22a located closer to one side, arranged in parallel, and in the vicinity of the arrangement of electrical joints 21a, 22a, there are provided holes 21b, 22b for passing pressure bonding screws 25 therethrough, both substrates 21, 22 are joined one on the other in the state in which the electrical joints 21a, 22a and holes 21b, 22b are opposed to each other, so as to be interposed between the pressing members 23, 24.

Each pressing member 23, 24 is formed of a metallic plate having a respective thickness, with a screw hole 23a formed on the pressing member 23, and a hole 24a formed on the pressing member 24, respectively, and further the pressing member 24 is formed with a pressing section 24b slightly bent toward the substrate 2 on a portion opposed to the electrical joints 21a, 22a for the connection so as to apply the pressure to the substrates 21, 22 in a secure manner, so that the electrical joints 21a, 22a are bonded with each other by inserting the pressure bonding screws 25 through the holes 24a of the pressing member 24 and the holes 21b, 22b of the substrates 21, 22, threadingly engaging and tightening them into threaded holes 23a of the presser member 23.

On the other hand, in order to improve the connecting state between circuit components, there is also known a method in which electric circuit components are electrically connected, using an electrical connecting member having a plurality of conductive members in an insulating carrier member, in the mutually insulating state.

The manufacturing method for such an electrical connecting member has been proposed in, for example, Japanese Patent Application Laid-Open No. 63-222437, Japanese Patent Application Laid-Open No. 63-228726, Japanese Patent Application Laid-Open No. 63-246835, and Japanese Patent Application Laid-Open No. 2-49385.

One of such electrical connecting members has been proposed in Japanese Patent Application Laid-Open No. 2-49385. In the following, this art will be described with reference to FIGS. 25A and 25B.

FIGS. 25A and 25B shows a conventional electrical connecting member and the connected state of substrates such as printed boards by the use of that member, and FIGS. 25A and 25B are explanation views for illustrating the forms before and after the connection of electrical connecting member, respectively. In the figure, 1 is an electrical connecting member, and 4, 5 are substrates such as printed boards which are electrical circuit boards to be connected. The electrical connecting member 1 is constituted in such a manner that holes are bored into a film-like carrier 2 made of an electrical insulating member, spaced at predetermined intervals, and a plurality of conductive members 3 are provided within the holes in the mutually insulating state. One end of each conductive member 3 is exposed on one face of the carrier 2, and the other end is exposed on the other face of the carrier 2, in the form of slightly projecting from the surface of the carrier 2, the diameter of each end portion being slightly larger than that of the hole to prevent the member from getting out of the hole.

The dimension of each portion in the electrical connecting member 1 is such that the thickness of the carrier 2 is about 10 $\mu$m, the diameter of the hole (column portion of conductive member) is about 20 $\mu$m, the pitch between holes is about 40 $\mu$m, and the amount of projection of the conductive member 3 is about several $\mu$m on both front and back faces, as shown in FIG. 25A.

Note that the conductive members 3 are made of a metal having an excellent conductivity, which may be often gold (Au) or gold alloy. The interval between conductive members 3 can be determined under the condition in which the insulating property is assured between adjacent conductive members 3.

The connecting form of the electric circuit component with this electrical connecting member 41 is shown FIG. 25B. In FIG 25A figure 4, 5 are electric circuit components to be connected, and when they are connected using the electrical connecting member 1, the electric circuit components 4, 5 are laid on both faces of the carrier 2, the electrodes 6, 7 for use as the connecting ends are aligned with each other in a plan view, and then these electric circuit components are pressurized and bonded by appropriate means against exposed ends of conductive members 3 on respective opposed faces. Thereby, the electrodes 6, 7, i.e., the electric circuit components 4, 5 are electrically connected via the conductive member 3.

In this connection, it is possible to cope with the increase in the number of joints by disposing densely the conductive members 3 on the face of carrier 2, so that the electrical connection between electrodes 6, 7 is made via a plurality of conductive members 3, as shown. Since these conductive members are of short size, there is the effect that the electrical resistance at the connecting portion can be maintained quite small, with a decreased heating due to the conduction of the current, and a small floating capacitance thereof contributes to the reduction of delay time, whereby the difficulty with the conventional connecting method such as the wire bonding method or TAB method can be overcome.

As the method for joining the electric circuit components using the electrical connecting member more securely, a thermocompression bonding method is well known.

FIG. 26 is a typical view illustrating the thermocompression method and its apparatus for connecting the printed boards with each other, on a partially enlarged scale, in which 4, 5 are substrates such as printed boards which are electric circuit components, 1 is an electrical connecting member interposed between both substrates 4, 5, and 50 is a press.

As clearly seen from FIG. 27, the substrates 4, 5 have the printed wirings applied on one face (or both faces), electrical joints 6, 7 being collectively arranged at positions closer to one side, and the electrical connecting member 1 is formed in such a manner that a plurality of holes 3b bored into the carrier 2 made of an electrical insulating material are filled with conductive members made of gold, each one end of which is exposed to one face of the carrier and the other end thereof is exposed to the other face of the carrier, in the form of being slightly protruded from the surface of the carrier, as shown in FIG. 27.

The electrical connecting member 1 is sandwiched and joined between substrates 4, 5, with the electrical joints 7 of the substrate 5 being opposed to one ends of the conductive members 3 provided on the electrical connecting member 1, and the electrical joints 6 of the substrate 4 being opposed to the other ends of the conductive members 3, and then disposed in this state between the upper and lower halves 51, 52 containing heaters in the press 50.

The upper and lower halves 51, 52 each are secured to pressurizing portions P on a base board B with the interposition of heat insulating members 53, 54, respectively, the electrical joints 6, 7 of the substrates 4, 5 and the conductive members 3 of the electrical connecting member 1 are heated up to a temperature of 350 to 400° C. and pressed under a predetermined pressure.

The electrical joints 6, 7 of the substrates 4, 5 and the conductive members 3 of the electrical connecting member 11 are bonded together under pressure in the heated state to be electrically connected with each other in an alloyed state due to the solid phase metal diffusion.

By the way, such a thermocompression bonding process is shown in detail in FIGS. 28A–28D. FIGS. 28A–28D illustrate a typical cross-sectional view showing the process of bonding compressively the electrical connecting member 1 sandwiched between the substrates 4, 5. First, as shown in FIG. 28A, the electrical joints 6, 7 of the substrates 4, 5 are placed into contact with the conductive members 3 of the electrical connecting member 1 carried therebetween from both face sides, and if the substrates 4, 5 are pressurized, the carrier 2 between adjacent conductive members 3 starts to bulge in the upper and lower directions, due to the deformation of each conductive member 3, particularly with the increasing diameter of column portion located within the carrier 2 (FIG. 28B), then making contact with the surfaces of the substrates 4, 5 if further pressurized (FIG. 28C), and finally the conductive members 3 and the carrier 2 fill a gap between the substrates 4, 5 (FIG. 28D).

FIG. 29 is a graph showing the relation between the amount of deformation of the conductive member and the pressure against the substrate 4, 5 in the above-mentioned process, with the amount of deformation in the axis of abscissas and the pressure in the axis of ordinates. As will be clear from this graph, the pressure may suffice to be small in a process in which the conductive member mainly deforms as shown in FIG. 28B, and if the carrier 2 is placed into contact with the substrates 4, 5 and starts to be deformed, the pressure starts to increase abruptly, and at a state as shown in FIG. 28D, the deformation does not rise even if the pressure is increased.

However, with the connecting method for the electric circuit components as shown in FIG. 24, there is the problem that the electric circuit components 21, 22 are wide and long, and there are a great number of electrical joints to be connected, in which if the density becomes high, it is necessary to increase the number of pressure bonding screws 25 for applying a uniform pressure to each electrical joint but if the number of pressure bonding screws 25 increases, the number of holes 21b, 22b for passing respective screws must be increased correspondingly, so that the wiring patterns are restricted, and if the density of electrical joints is further increased, it is difficult to secure a space for providing the holes 21b, 22b.

Also, when the electric circuit components are electrically connected using the electrical connecting member, if the amount of deformation in the bump of the electrical connecting member is small, a proper force is not exerted between the conductive members of the electrical connecting member and the electrical joints of the substrate, so that the metallic solid phase diffused junction is not securely made, producing the so-called non-compression bonding, as shown in FIG. 28A. This is remarkable when there is a dispersion in the height of conductive members or substrate joints.

When the electric circuit components are thermally bonded under pressure using the electrical connecting member, and using an apparatus as shown in FIGS. 26 and 27, there is the problem that it is difficult to adjust the upper and lower halves 51, 52 of the press 50 to be completely in parallel under the heating condition with the heater, and to bond the substrates 4, 5 and the electrical connecting member 1 compressively with a uniform pressure, due to the occurrence of warpage of the upper and lower halves 51, 52 and the substrates 4, 5, resulting in many failures in the compression bonding and a low yield.

To provide the measure against it, a method and apparatus has been proposed in which the electrical joints 6, 7 of each substrate 4, 5 and the conductive members 3 of the electrical connecting member 1 are individually bonded compressively one for each time, but there is the problem that if the number of electrical joints 6, 7 and conductive members 3 exceeds for example 1000, the operational efficiency will decrease.

Further, in the connection with the electrical connecting member 1, it is necessary to realize the metallic junction state between the electrodes 6, 7 of the electric circuit components 4, 5 and the conductive members 3, but as these contact surfaces are not generally clean, and are covered with oxidized or contaminated layers, it is necessary to apply the pressure to destroy the oxidized and contaminated layers and permit the contact with a new generating face, when pressing the electrodes 6, 7 against the conductive members 3.

Therefore, it is necessary to make the diffused junction between the conductive members of electrical connecting member and the electrodes of electrical circuit component, as shown in FIG. 24 previously described, in the compression bonding with a compression bonding apparatus, or the heating under pressure.

However, in the former, when the electric circuit components to be connected are weak against the pressure, a damage may be caused. On the other hand, in the latter method, as the necessary pressure is small, there is no fear that the electric circuit component may be damaged due to the pressure, and the connecting operation is facilitated, but for a good diffused junction state, the heating up to 200 to 350° C. is required, so that the electric circuit member inferior in the heat resistance such as a plate may be damaged due to the heating.

SUMMARY OF THE INVENTION

The present invention has been achieved in the light of the above-mentioned state of affairs, and is aimed to provide a connecting method for electric circuit components allowing for the compression bonding under a uniform pressure, irrespective of the density of electrical joints.

Another object of the present invention is to provide a connecting method and a connecting apparatus without damaging any electric circuit component with the pressure.

Another object of the present invention is to provide a manufacturing method for electric circuit component allowing for a securer compression bonding between electrical joints of electric circuit components such as substrate and conductive members of an electrical connecting member.

A further object of the present invention is to provide an electrical connecting member and a connecting method using the connecting member allowing for the connection of electric circuit components without requiring any pressure by the use of a special compression bonding apparatus and any heating at a high temperature.

In order to accomplish the above-mentioned objects, a main constitution of the method for the electrical connection between electrical joints of the electric circuit components according to the present invention is that:

the electric circuit components are disposed so that the joints for the electrical connection are opposed to each other, and the electrical connection between electrical joints is made by a biasing force which is exerted by an elastic member from at least one side of the electric circuit component so that the biasing force is exerted in succession from an intermediate position of connecting area for the connection to the periphery of the connecting area, or the electric circuit components are disposed so that the joints for the electrical connection are opposed to each other, and the electrical connection between electrical joints is made by compressing them between members having the magnetic force, or the electric circuit components are compressed in part via the electrical connecting member, and the electric circuit components and the electrical connecting member are thermally compressed by applying the heat to that partially compressed portion while moving that portion, or a plurality of conductive members which are held in mutually insulating state are provided on a carrier containing a thermosetting adhesive, an electrical connecting member having both ends of conductive member exposed to respective faces of the carrier is placed into contact with the electric circuit components for the electrical connection, and heated up to a predetermined temperature, causing the curing and shrinkage in the thermosetting adhesive contained in the carrier, so that the electric circuit components and the electrical connecting member are joined together, or a plurality of conductive members which are held in mutually insulating state are provided on a carrier, an electrical connecting member having both ends of conductive member exposed to respective faces of the carrier and having a thermosetting adhesive applied on a surface for the connection to the carrier is placed into contact with the electric circuit components for the electrical connection, and heated up to a predetermined temperature, causing the curing and shrinkage in the thermosetting adhesive applied on the carrier, so that the electric circuit components and the electrical connecting member are joined together with the curing and shrinkage of the thermosetting adhesive, or there are provided a process of disposing the electric circuit components via the electrical connecting member so that the joints are opposed, and a process of welding under pressure the electrical connecting member and the electric circuit components so that the amount of deformation in the diameter of conductive member exposed from the carrier is equal to or more than 17%.

In order to accomplish the previously-described objects, a main constitution of a connecting apparatus according to the present invention is that one electric circuit component for the connection is provided on its portion with a pressurizing mechanism for exerting a biasing force for the electrical connection between electric circuit components, means for moving a pressed portion with the pressure mechanism while exerting the biasing force on the electric circuit component at the portion thereof, means for adjusting the biasing force to be applied to the electric circuit component, and a heating portion useful for the thermocompression bonding.

Also, in order to accomplish the previously-described objects, a constitution of electrical connecting member according to the present invention is to comprise:

a carrier made of an electrical insulating material containing a thermosetting adhesive, and a plurality of conductive members held on the carrier in mutually insulating state, wherein one end of each conductive member is exposed to one face of the carrier, and the other end of each conductive member is exposed to the other face of the carrier.

Also, the constitution of electrical connecting member is to comprise:

a carrier made of an electrical insulating material, and a plurality of conductive members held on the carrier in mutually insulating state, wherein one end of each conductive member is exposed to one face of the carrier, and the other end of each conductive member is exposed to the other face of the carrier, and wherein a thermosetting adhesive is applied onto at least one surface of the carrier.

With the above-described method of the present invention, it is possible to make the compression bonding under a uniform pressure between electrical joints arranged on long electric circuit components by deforming an elastic member from an intermediate position of the electrical connecting area and pressing it against the surface of electric circuit component.

Also, it is possible to compress the electric circuit components with the magnetic force, weld under pressure the electrical joints securely, and place them into contact if necessary, without heating the electric circuit components.

Thereby, with the present invention, it is possible to make the compression bonding between a number of electrical joints on electric circuit components, opposed to each other, and conductive members of the electrical connecting member under a uniform pressure while heating them at every predetermined times.

Also, by virtue of the electrical connecting member, it is possible to make a securer connection, because the bump is deformed to a predetermined amount in making the connection.

Also, in an electrical connecting member in which a carrier holding conductive members contains an adhesive having the thermosetting property, or has a coating layer of a thermosetting adhesive on both faces thereof, the carrier itself or the coating layer on that surface is shrunk with the curing and shrinkage of the adhesive, and due to a shrinkage force produce therein, the electric circuit components on both faces of the carrier are pressed against the conductive members, thereby producing an excellent connecting state therebetween. The pressure required in this case is sufficient if it can maintain the direct contact between the electric circuit components and the electrical connecting member, and the force greater than necessary is not required. Also, the heating required may be sufficient at a curing temperature of the adhesive (normally 100 to 200° C.), and the high temperature is not necessary. Therefore, the electric circuit components weak in the strength or the electric circuit components weak in the high temperature can be connected stably and securely without damaging them.

BRIEF DESCRIPTION OF THE DRAWINGS

FIG. 11 is a partially enlarged view of FIG. 10.

FIG. 13 is a typical view showing the state in operation in another example of the present invention.

FIG. 14 is a typical view showing another state in operation in the example of the present invention.

FIGS. 16A–16E are typical views showing the manufacturing process of an electrical connecting member according to a third embodiment of the present invention.

FIGS. 17A and 17B are explanation views for a connection method of electric circuit components with an electrical connecting member according to the present invention.

FIG. 18 is a typical cross-sectional view of an electrical connecting member fabricated with the example.

FIGS. 19A and 19B are graphs showing the relation between the rate of junction and the rate of deformation and the pressure.

DETAILED DESCRIPTION OF THE PREFERRED EMBODIMENTS

The present invention will be specifically described with reference to the drawings by way of the examples.

EXAMPLE 1

Figure 1A:
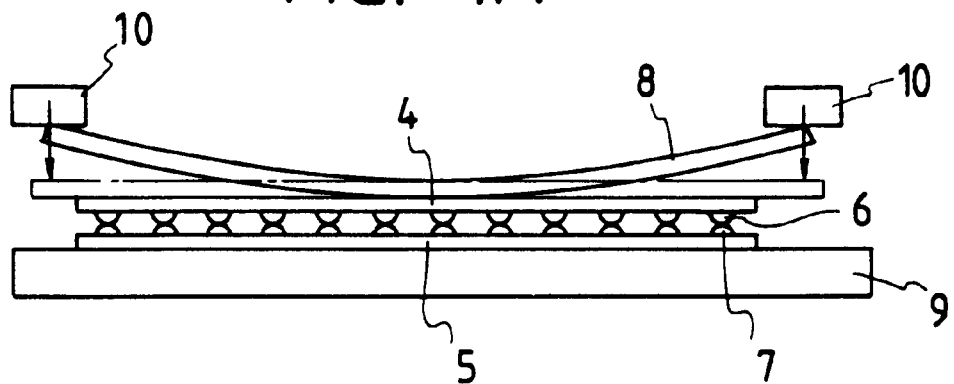
FIGS. 1A and 1B are typical views showing an example of the present invention.
Figure 1B:
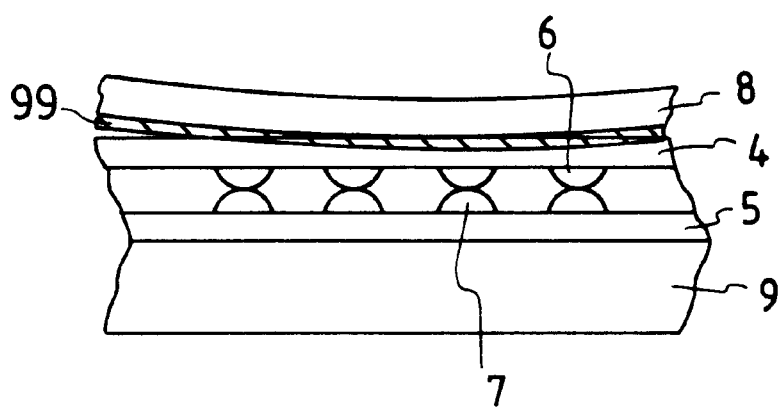

FIG. 1 shows the state in operation for a connecting method of electric circuit components, according to the present invention, in which FIG. 1A is a typical side view and FIG. 1B is a partial enlarged side view.

Figure 4A:
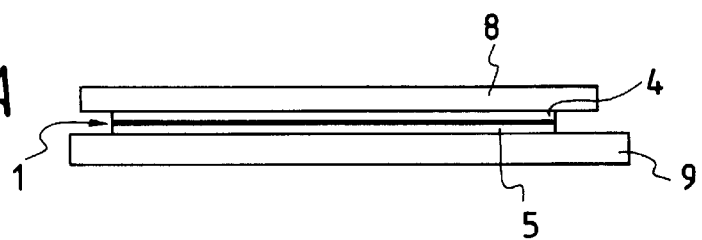
FIGS. 4A and 4B are typical side views showing the state after the compression bonding in the example as shown in FIG. 3.
Figure 4B:
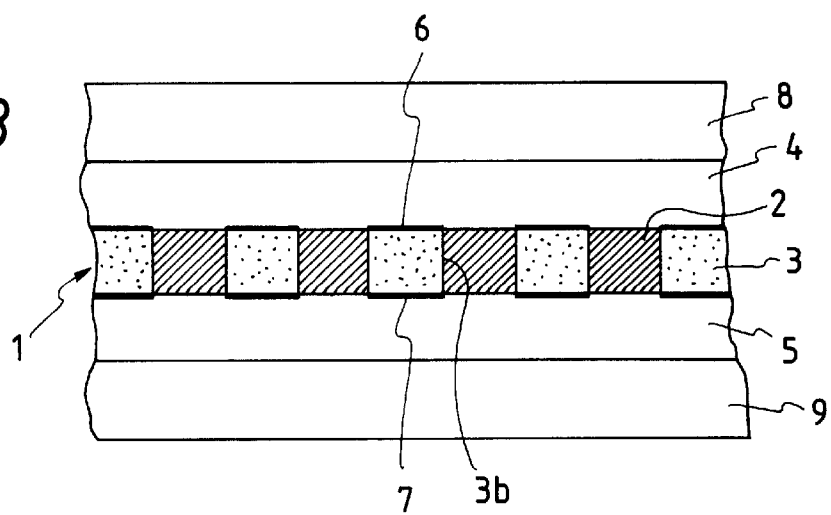
Figure 5:
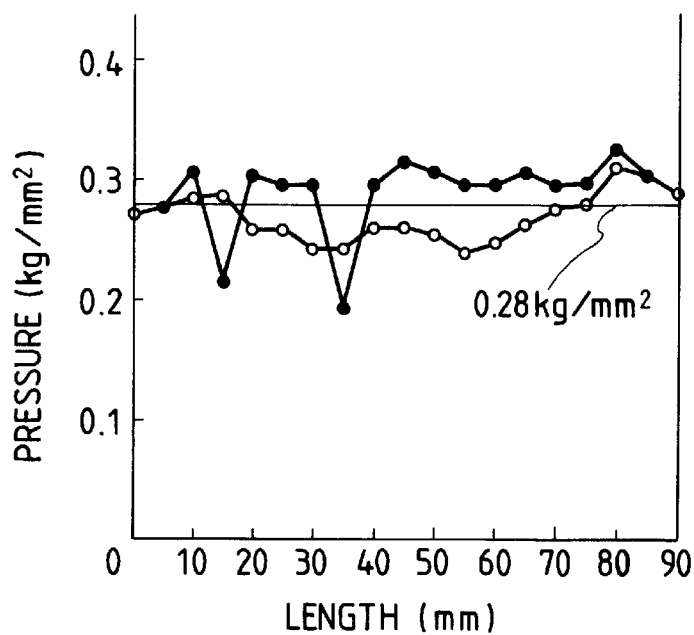
FIG. 5 is a graph showing the experimental results in the example as shown in FIG. 1.

In the FIGS. 4, 5 are long size substrates which are electric circuit components such as printed boards, 9 is a supporting member, and 8 is a leaf spring member as the elastic member exerting a biasing force against the printed board. Each substrate 4, 5 has the printed wirings applied on one face (or both faces), and electrical joints 6, 7 for the connection with the other substrate are arranged closer to one side. Each electrical joint 6, 7 is formed using a conductive material such as gold so as to be swollen slightly from the surface of the substrate 4, 5. In making the electrical connection, both substrates 4, 5 are laid on the supporting member 9, one on the other, with electrical joints 6, 7 opposed to each other, in which the leaf spring member 8 serves to apply a compression bonding load from the substrate 4. The supporting member 9 is formed using a metallic plate having a significant thickness to be slightly wider than the substrates 4, 5.

The leaf spring member 8 is bent like an arc at a predetermined radius of curvature, disposed on the substrate 4 so that a central portion of its convex face side is opposed to an upper surface of the substrate 4 at an intermediate position of electrical connecting area for the electrical connection between electrical circuit components, and then pressed by pressing members 10, 10 at both end portions.

In the above explanation, the leaf spring member 8 and the substrate 4 are directly contacted, but it should be noted that an elastic member 99 such as silicon rubber as the protective member may be interposed therebetween to distribute the pressure of the leaf spring member 8 against the substrate 4, or not to damage the circuit components as indicated in FIG. 1B.

The pressing member 10 is linked to pressing means such as a press, not shown, so as to bend the leaf spring member 8 from a state as indicated by the solid line in FIG. 1A to a flat state where the whole of its lower surface is placed in facial contact with the upper surface of the substrate as indicated by the dashed line.

At this time, when the leaf spring member is being bent from an intermediate position of the connecting area (between end portions of the connecting area) in the substrate 4 which is contacted with a loop of the leaf spring, the biasing force acts on the substrate 4 in succession toward the end portions.

The length of the leaf spring 8 which is bent to be flat is set to be slightly longer than the length of the substrate 4, 5, and the width b is set to cover sufficiently the electrical joints 6, 7 for compression bonding and its neighborhood.

And the thickness h of the leaf spring member 8 can be determined by the following way, based on the length determined by the dimensions of the substrates 4, 5, the width b, and the total load p necessary for the compression bonding of electrical joints.

$$h^2 = (6 \cdot p \cdot 1)/(\sigma_{max} \cdot b) \quad (1)$$

Where $\sigma_{max}$: maximum bending stress (which is set from an allowable bending stress with a safety factor)

Since the amount of deflection δ in the leaf spring member 8 can be calculated from the following expression (2), the initial radius of curvature R for the leaf spring member is defined according to the expression (3).

$$\delta = (4 \cdot p \cdot 1^3)/(E \cdot b \cdot h^3) \quad (2)$$

Where E: Young's modulus.

$$R = (R-\delta)^2 + 130^2 \quad (3)$$

Supposing that the total compression bonding load p necessary for the compression bonding of electrical joints in 25 kg, the width b of the leaf spring member is 6 mm, the length 2e is 130 mm, and the maximum bending stress $\delta_{max}$ is 150 kg/mm, the thickness of the leaf spring member 8 is about 5 mm. Also, the amount of deflection δ is 16.74 mm, and the radius of curvature R is about 515 mm.

Figure 2:
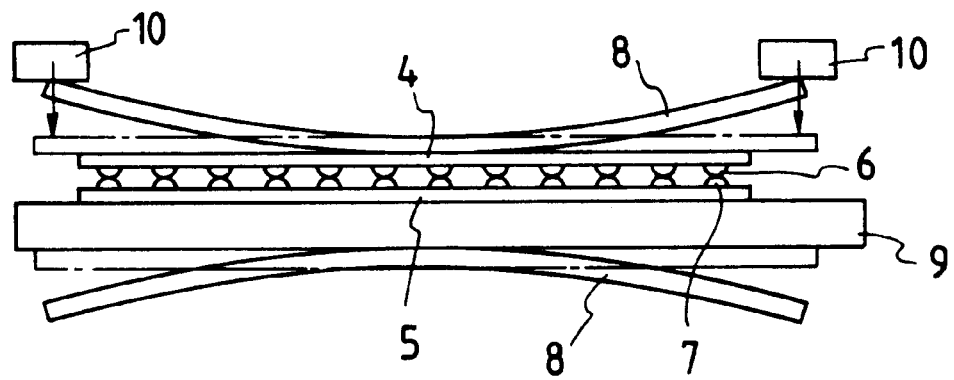
FIG. 2 is a typical view showing another example of the present invention.

FIG. 2 is a typical view showing another example of the present invention.

In this example 2, a leaf spring member 8 having the substantial same dimensions as the leaf spring member 8 as previously described is also disposed under the supporting member 9, with it convex side being in contact with the supporting member 9, which is supported by the leaf spring member 8 against a biasing force of the leaf spring member 8 from upward, thereby preventing the deflection of the supporting member 9 from occurring, and allowing for a uniform compression bonding between electrical joints of the substrates 4, 5.

The other constitution and action are substantially the same as shown in FIG. 1, wherein like numerals are attached to the corresponding parts, and the explanation will be omitted.

However, since the deflection does not occur in the supporting member 9 with this method, there is the advantage that the supporting member 9 can be made thin. The dimensions of the leaf spring member 8 can be set in the same way as in the example 1. It will be appreciated that in the example 2, an elastic member such as a silicon rubber sheet may be interposed between each leaf spring member 8, 8, the substrate 4 and the supporting member 9.

Figure 3A:
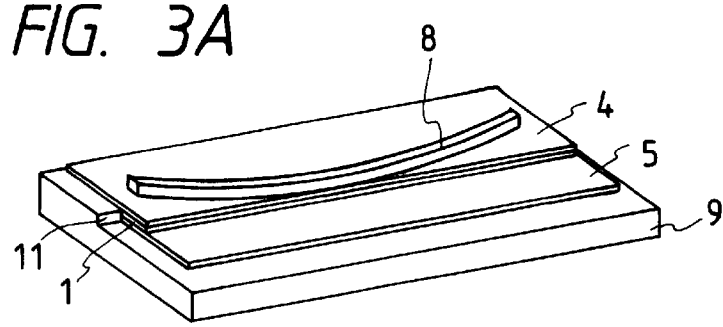
FIGS. 3A and 3B are typical views showing the state before the compression bonding in a further example of the present invention.
Figure 3B:
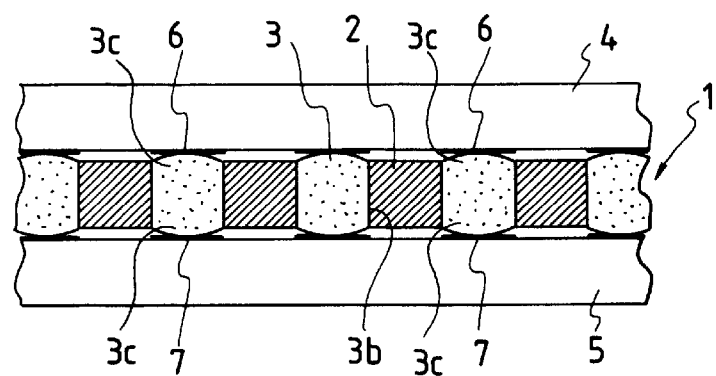

FIG. 3A is a typical view showing the state before the compression bonding in another example of the present invention, and FIG. 3B is a partial enlarged side view thereof. FIG. 4A is a side view after the compression bonding, and FIG. 4B is a partial enlarged side view of FIG. 4A. In this example, the present invention is applied where conductive members 3 of the electrical connecting member 1 are interposed for the compression bonding between electrical joints 4, 5 of the substrates 4, 5.

The supporting member 9 is made of a metal, and formed as a thick rectangular shape, on one face thereof being formed a step portion 11 in parallel with the long side at a central portion in the width direction and having a height corresponding to the sum of the thicknesses for the substrate 5 and the electrical connecting member 1. On a lower side of one face of the supporting member 9, the substrate 5 and the electrical connecting member 1 having the conductive members opposed to the electrical joints at one end portion thereof are arranged along the step portion 11, while on a higher side thereof, the substrate 4 is arranged with its electrical joints 6 opposed to the conductive members 3 of the electrical connecting member 1 at the other end portion thereof. The leaf spring member 8 is disposed in alignment with a position where the electrical joints 6, 7 of the substrates 4, 5 and the conductive members 3 of the electrical connecting member 1 are opposed to each other. The electrical connecting member 1 is formed in such a manner that a plurality of through holes bored into the carrier 2 made of an electrical insulating material are filled with the conductive members 3 made of gold, each one end portion 3c thereof being exposed to one face of the carrier 2, and the other end portion 3c being exposed to the other face of the carrier 2, in the form of being slightly swollen from the surface of the carrier 2.

However, in this example, the pressing force is applied to both end portions of the leaf spring member 8 in the state as shown in FIGS. 3A and 3B, and the electric circuit components are mutually connected by the compression bonding between the electrical joints and the conductive members 3, as shown in FIGS. 4A and 4B.

The dimensions of the leaf spring member 8 are set in the same way as in the previous example 1. It will be appreciated that an elastic member such as silicone rubber for the protection of a circuit board may be also interposed between the leaf spring member and the substrate 4 in this example.

FIG. 5 is a graph showing the pressure distribution of the leaf spring member in a longitudinal direction in which using a leaf spring member having a length of 90 mm, a thickness of 3.5 mm and a radius of curvature of 550 mm in the example as shown in FIGS. 1A and 1B, the load of 50 kg is applied to both end portions to make the compression bonding between the electrical joints 6, 7 of substrates 4, 5, with the axis of abscissas indicating the length (mm) from one end of the leaf spring member, and the axis of orinates indicating the pressure (kg/mm$^2$). In the graph, the plot with a sign ○ shows a result in which the silicone rubber sheet is interposed between the leaf spring member and the substrate, and the plot with a sign ● shows a result in which the leaf spring member is placed in contact with the surface of the substrate. As will be seen from these graphs, the dispersion of the load for use with the compression bonding ranges from 0.27 to 0.4 kg/mm$^2$ when the silicone rubber sheet is not used, and it ranges from 0.18 to 0.25 kg/mm$^2$ when the silicone rubber sheet is used. Thus, it can be confirmed that the dispersion in the pressure for the compression bonding is smaller when the silicone rubber sheet is used, but even if the silicone rubber sheet is not used, the dispersion in the pressure is within an allowable range.

Figure 6:
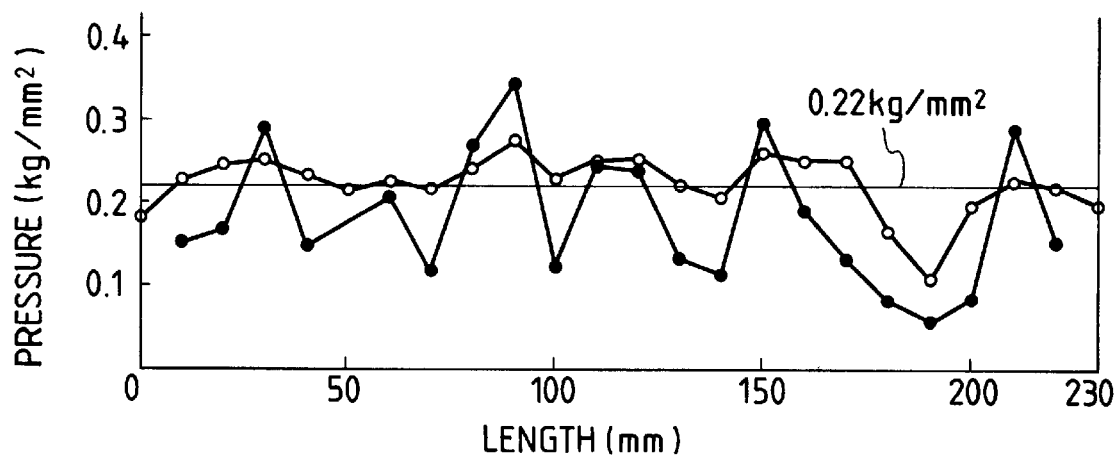
FIG. 6 is a graph showing the experimental results as shown in FIGS. 3 and 4.

FIG. 6 is a graph showing the pressure distribution in which using a leaf spring member having a length of 230 mm, a thickness of 9.0 mm and a radius of curvature of 1500 mm, the substrate is pressed directly or indirectly with the interposition of a silicone rubber sheet, with the axis of abscissas indicating the length (mm) from one end of the leaf spring member, and the axis of ordinates indicating the pressure (kg/mm$^2$). In the graph, the plot with a sign ○ shows a result in which the silicone rubber sheet is interposed between the leaf spring member and the substrate, and the plot with a sign ● shows a result in which the silicone rubber sheet is not interposed.

From these graphs, it has been confirmed that the dispersion of the pressure is smaller when the silicone rubber sheet is used, and the dispersion of the pressure is within an allowable range even if the silicone rubber sheet is not used.

Figure 7:
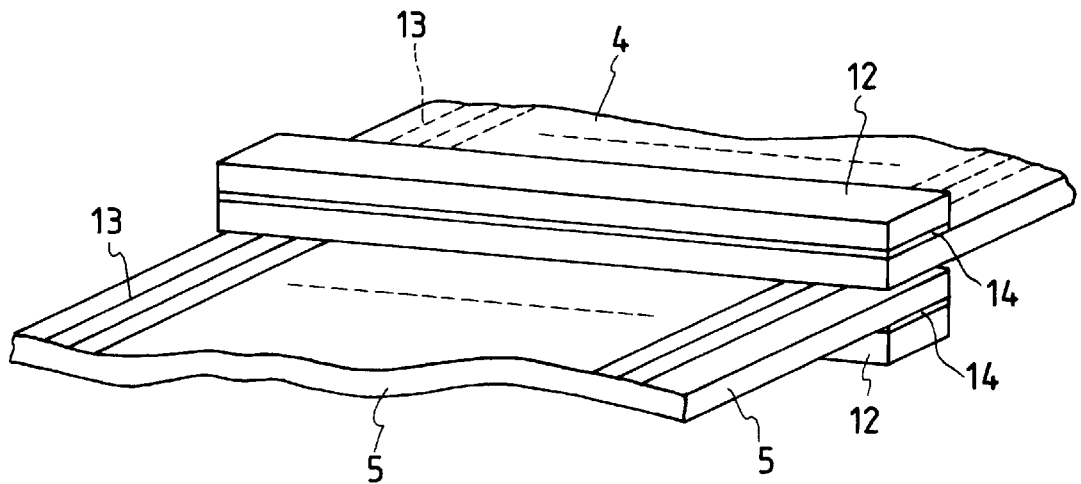
FIG. 7 is a typical view showing an example in which the junction is made using a magnetic force.
Figure 8A:
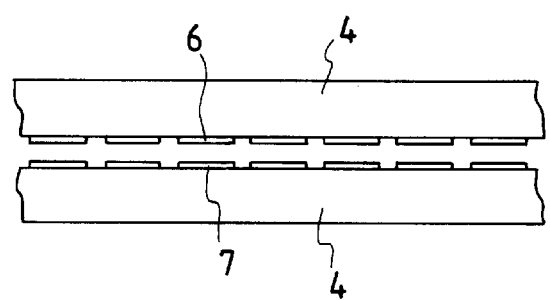
FIGS. 8A and 8B are operation explanation views showing the states before and after the pressure welding between electrical joints, respectively.
Figure 8B:
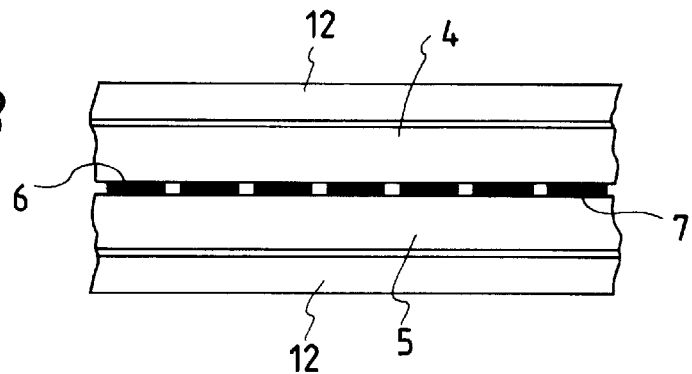

FIG. 7 is a typical view showing the state in operation for the connecting method of electric circuit components, according to the present invention, in which FIGS. 8A and 8B are operation explanation views showing the state before and after the connection. In the figure, 4, 5 are long size substrates which are electric circuit components such as printed boards, and 12 are magnets. Each substrate 4, 5 has the printed wirings 13, 13 applied on one face (or both faces), and the electrical joints 6, 7 are arranged closer to one side of a plurality of substrates 4, 5, opposed to each other. Each electrical joint 6, 7 is formed using a conductive material such as gold to be swollen slightly from the surface of substrate 4, 5.

Both substrates 4, 5 have the electrical joints 6, 7 arranged, one end portions thereof opposed to each other in the upper and lower sides, as shown in FIG. 8A, for example, in which a permanent magnet 12 with a silicone rubber sheet 14 as the protective member interposed on a lower surface of the substrate 5 in the neighborhood of one side where the electrical joints 6 are arranged, and a permanent magnet 12 with a silicone rubber sheet 14 interposed on an upper surface of the substrate 4 as the protective member in the neighborhood of one side where the electrical joints 6 are arranged, are positioned with different magnetic poles opposed to each other in the upper and lower sides.

Thereby, both permanent magnets 12, 12 are attracted mutually by their magnetic forces, and this attractive force allows the electrical joints 6, 7 of both substrates 4, 5 to be secured with each other as shown in FIG. 8B.

The permanent magnet 12 is made of one or more kinds of materials such as ferrite, Fe, Ni, Co rare earth element, and formed as a slender shape of rectangular cross section, having substantially the same length as the width of the substrate 4, 5, and the width corresponding to the positions opposed to the electrical joints and its neighborhood, in which its one end side is magnetized as the N pole and the other end side is magnetized as the S pole.

In the above example, the permanent magnets 12, 12 are used, but the electromagnets can be also used, in which each electromagnet is fixed to a back face of the substrate 4, 5, and both electromagnets are excited, when the substrate are energized, so as to secure the electrical joints of the substrates 4, 5 under pressure, while the electromagnets are deexcited, when the substrates are deenergized, so as to separate the substrates 4, 5 with the action of the elastic member, not shown.

Next, another example is shown. In this example, an electrical connecting member is interposed between the substrates 4, 5 constituting the electric circuit component and indirectly welded under pressure.

Figure 9A:
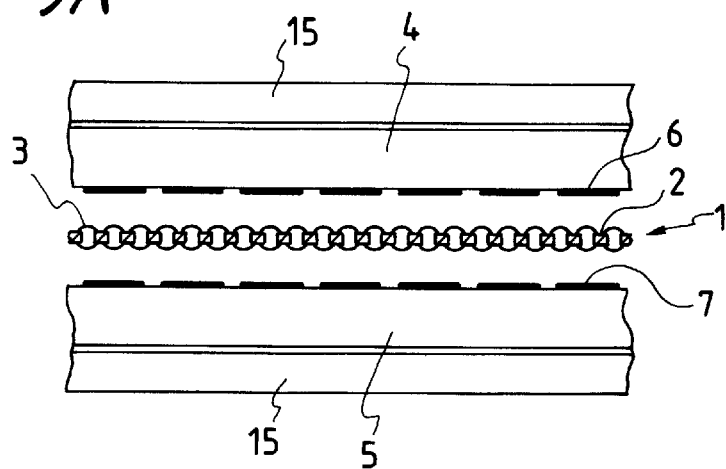
FIGS. 9A and 9B are operation explanation views showing the states before and after the pressure welding between electrical joints, respectively, in another example of the present invention.
Figure 9B:
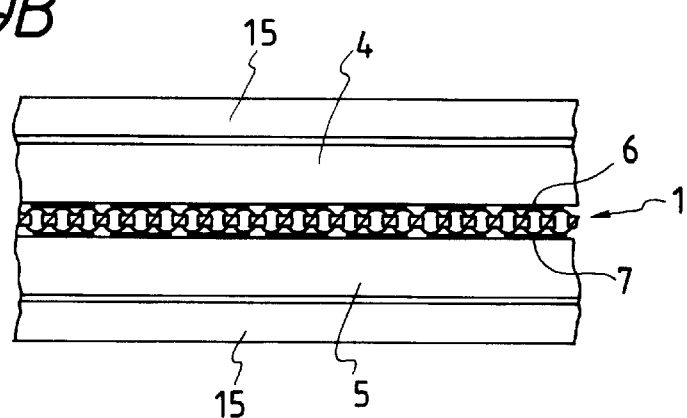

FIGS. 9A and 9B are operation explanation views for illustrating the state before and after the pressure welding of electrical joints 6, 7 on the substrates 4, 5, respectively, in this example. In the figure, 1 is an electrical connecting member, and 15, 15 are electromagnets.

The electrical connecting member 1 is formed, as previously shown and described, in such a manner that the through holes bored into a carrier 2 made of an electrical insulating material are filled with the conductive members 3 made of gold, each one end portion of which is exposed to one face of the carrier 2, and the other end is exposed to be other face of the carrier 2, in the form of being slightly swollen from the surface of the carrier 2, respectively.

Each conductive member of the electrical connecting member 1 has set the size and the pitch so that at least two or more conductive members 3 may be opposed to each one electrical joint 6, 7 of substrate 4, 5, as can be seen from FIGS. 9A and 9B. Each electromagnet 15, 15 is formed in such a manner that the whole size is substantially equal to the size of the electromagnet 14, 14 in the previous example by winding the coil around an iron core, and secured with an adhesive to the back face of each substrate 4, 5 so that different magnetic poles, when excited, are opposed to each other in the upper and lower sides.

The other constitution is substantially the same as in the example as shown in FIGS. 17 and 18, wherein like numerals are attached to corresponding portions, and the explanation will be omitted.

In this example, if both electromagnets 15, 15 are excited by energizing the coils, both substrates 4, 5 are pressed by the magnetic forces of both electromagnets 15, 15, in the state where the electrical connecting member is carried therebetween, so that the electrical joints 6 of the substrate 4 are welded under pressure via the conductive members 3 of the electrical connecting member 1 with the electrical joints 7 of the substrate 5.

Another example of the present invention will be described with reference to the drawings.

Figure 10:
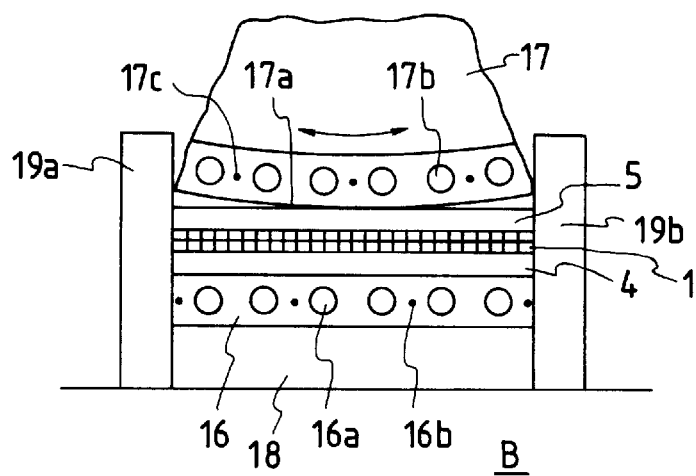
FIG. 10 is a typical view showing a thermocompression bonding method and its example.

FIG. 10 is a typical view showing a method and its apparatus for the thermocompression bonding between electric circuit components, according to the present invention, and FIG. 11 is a partial enlarged cross-sectional view. In the figure, 4, 5 are substrates such as printed boards which are electric circuit components, 1 is an electrical connecting member, 16 is a supporting base containing heaters 16a and thermocouples 16b, 17 is a pressurizing board, and B is a base. As can be clearly seen from FIG. 11, the substrates 4, 5 have the printed wirings (not shown) applied on one face (or both faces), the electrical joints 6, 7 being collectively arranged at the positions closer to one side, and the electrical connecting member 1 is formed in such a manner that a plurality of holes 3b bored into the carrier 2 made of an electrical insulating material are filled with the conductive members made of gold, each one end of which is swollen slightly from the surface of the carrier 2.

A pair of stoppers 19a, 19b movable for the positioning are spaced at a predetermined interval on the base board B, and between both stoppers 19a, 19b is disposed the supporting board 16 with the interposition of a heat insulating member 18, on which supporting board 16 are disposed both substrates 4, 5, laid one on the other, with the electrical joints 6 of the substrate 4 being opposed to one end portions of the conductive members 3 exposed to one face of the electrical connecting member 1, and the electrical joints 7 of the substrate 5 opposed to the other end portions of the conductive members 3, in which the pressure is applied by the pressurizing board 17 from upward of the substrate 4.

Figure 12:
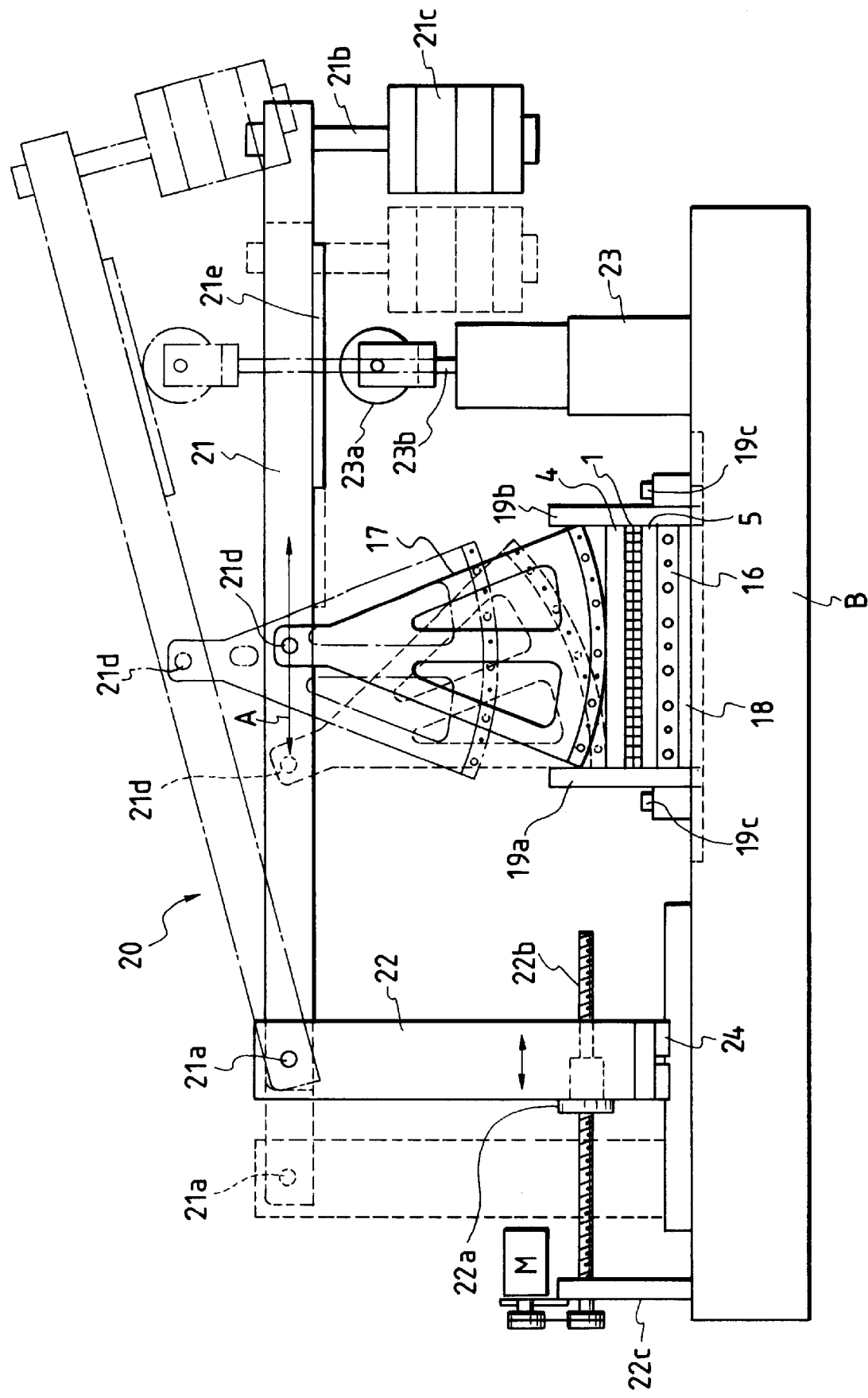
FIG. 12 is a side view showing a specific constitution of a thermocompression bonding apparatus.

The pressurizing board 17 is formed like a sector having a pressure face 17a curved as a circular shape at a predetermined radius of curvature, and contains heaters 17b and thermocouples 17c along the pressure face 17a, in which the center of curvature or the point O is borne on an arm constituting a pressurizing apparatus as shown in FIG. 12.

FIG. 12 is a side view of the pressurizing apparatus, in which there are disposed the stoppers 19a, 19b for arranging the substrates 4, 5 on a central portion of the base board B, a strut 22 on one side, and an air cylinder 23 for the evacuation on the other side, with a rod 23b mounting a roll 23a being directed upward. The strut 22 has its lower end portion supported on a linear guide 24 of the base board B, and stood movable horizontally as indicated by the arrow. This strut 22 is provided with a nut member 22a near the lower end, through which a ball screw 22b is inserted, one end of the ball screw 22b being borne through a supporting plate 22c provided on the base board B, which is linked via a belt to a motor M, whereby the strut 22 can be reciprocated horizontally as indicated by the arrow with the driving of the motor M.

On an upper end of the strut 22, the arm 21 has its one end secured with a shaft 21a, and is rotatable around the shaft 21a upward or downward. The other end portion of the arm 21 has a weight 21c suspended via a rod 21b vertically provided thereon, and on a substantial central portion thereof, the pressure board 5 is secured swingably around a shaft 21d as indicated by the arrow.

In the arm 11, a guide rail 21e is fixed at a position opposed to the roll 23a of the air cylinder 23, the driving of which causes the roll 23a to make contact with the guide rail 21e, lifting the arm 21 to be moved between a position indicated by the solid line and a position indicated by the dashed line around the shaft 21a at its one end, and causing the pressurizing board 17 to be retreated from between the stoppers 19a, 19b to make contact with the substrate 1 between the stoppers 19a, 19b.

With this thermocompression bonding apparatus 20, the air cylinder 23 for the evacuation is driven to rotate the arm 21 around the shaft 21a to retreat back to a position indicated by the dashed line, at which position a set screw 19c is loosened to open the stoppers 19a, 19b at a predetermined interval, between which stoppers 19a, 19b the heat insulating member 18 and the supporting board 16 are disposed, and the electrical connecting member 1 sandwiched between the substrates 4, 5 is laid thereon, whereby the stoppers 19a or 19b are positioned with the set screws 19c.

The heaters 16a of the supporting board 16 and the heaters 17b of the pressure board 17 are activated under the monitoring of the detected values of the thermocouples 16b, 17b, in which the substrates 4, 5 are set in a range from 340 to 400° C., and the weight 21 is set at a predetermined weight.

Then, the air cylinder 23 for the evacuation is retreated to place the central portion on the lower face of the pressurizing board 17 into contact with the central portion on the upper face of the substrate 4, under a load of the weight 21c, in which state the motor M is driven to retract the strut 22, and the arm 21 to a position indicated by the broken line. Thereby, as a result that the shaft 21d at a mating point is moved to a position A, the pressurizing board 17 is rotated around the shaft 21d, thereby moving the abutting point against the upper face of the substrate 4 to the left side in succession. As one end portion of the pressurizing board 17 slides on a wall surface of the stopper 19a, it rolls on without slippage with the substrate 4. Thereby, the electrical joints 6, 7 of the substrates 4, 5 and the conductive members 3 of the electrical connecting member 1 are bonded together compressively, plural parts each time, successively, with the pressure welding and the rolling of the pressurizing board 17.

If the pressurizing board 17 reaches a position at which is one side is in parallel to an inner face of the stopper 19a, as indicated by the broken line, the motor M is reversely rotated, causing the pressurizing board 17 to a position at which the other side of the pressurizing board 17 is in parallel to the inner face of the stopper 19b. The operation is repeated by plural number until the compression bonding is terminated.

The inner faces of the stoppers 17a, 17b abutting on both ends of the pressurizing board 17 may be formed as a concave face to prevent any slippage between the pressurizing board 17 and the substrate 4. Also, to prevent the slippage of the pressurizing board 17 with respect to the substrate 4, a number of curved lines crossing on the pressure face may be formed as a rough face.

In the above example, the electrical joints 6, 7 of the substrates 4, 5 correspond to the conductive members 3 of the electrical connecting member 1, one to one, but a plurality of conductive members 3 can correspond to each electrical joint 6, 7, by providing a smaller pitch, in which case the substrates 4, 5 and the electrical connecting member 1 can be opposed to each other only with the alignment, whereby the operation efficiency can be further improved.

A further example will be described below. In this example, instead of the pressurizing board 17 as shown in the example, a pressure roll 24 is used. FIG. 13 is a typical view showing the operation state of the example.

In the figure, 24 is the pressure roll, in which both end portions are borne on supporting legs, not shown, which serve to reciprocate horizontally the pressure roll 24 by applying a predetermined load against the surface of the substrate 4, and thereby press the electrical joints 6, 7 of the substrates 4, 5 and the conductive members 3 of the electrical connecting member 1 for the compression bonding.

It will be appreciated that the heater and the thermocouple may be provided in the neighborhood of a peripheral face of the pressure roll 24. Also, the peripheral face of the pressure roll may be a rough face to be useful for the prevention of slippage.

The other constitution and action are substantially the same as in the previous example, in which like numerals are attached to corresponding parts and the explanation will be omitted.

Next, a still further example will be described below with respect to FIG 14. In this example, instead of the pressurizing board 17 in the previous example, a press having a smaller size than the width of the substrate 4, 5 is used to press a part of the substrate 4 with a predetermined pressure, which is then lifted once to be moved to the left or the right by a predetermined length, and the above-described operation is repeated. Note that the heater and the thermocouple may be provided in the neighborhood of the pressure face.

The other constitution and action are substantially the same as in the example 1, in which like numerals are attached to corresponding parts and the explanation will be omitted.

Next, an example for the electrical connecting member allowing for the connection without necessity of any great connecting pressure and high temperature, and its fabricating method, will be described.

Figure 15A:
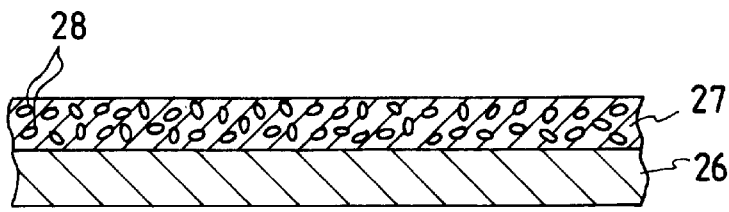
FIGS. 15A–15E are typical views showing the manufacturing process of an electrical connecting member according to a first embodiment of the present invention.

When the electrical connecting member of this example is fabricated, a metallic plate (e.g., copper plate) useful for the base is prepared, as shown in FIG. 15A, and on the metallic plate 26, a negative-type photosensitive polyimide resin 11 containing an adhesive 28 in a number of capsule-like lumps is applied. This polyimide resin 27 constitutes a carrier 2 on the electrical connecting member 1, as will be described later, the application thickness of polyimide resin being thicker than the thickness of the carrier 2 to be obtained, in consideration of an decrease with the splashing of the solvent and the shrinkage in the subsequent curing process. The adhesive contained in the polyimide resin requires to have the thermosetting property, and may be an adhesive resin such as epoxy, polyester, polyurethan, phenol, resorcinol, urea, or melamine.

Figure 15B:
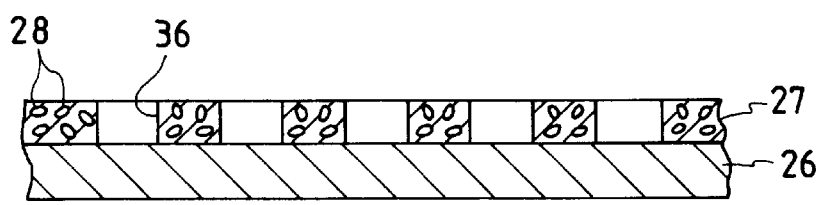

Subsequently, the surface of coating layer made of polyimide resin is covered with a photomask (not shown) having a predetermined pattern formed, and then irradiated (exposed) via the photomask and developed. Thereby, an unexposed portion is removed, and a number of through holes 3b, 3b penetrating through the coating layer of polyimide resin from the inside to the outside are formed, as shown in FIG. 15B.

Figure 15C:
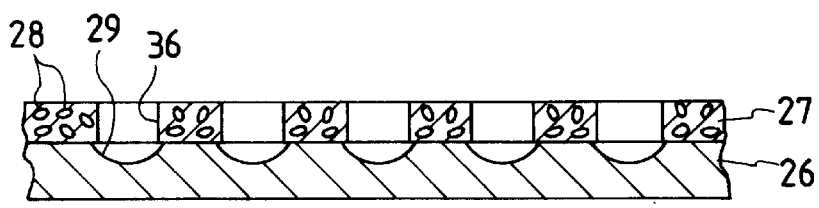

Then, the etching is made from the surface side of polyimide resin, so that the metallic plate 26 located beneath the through holes 3b, 3b is etched and recess portions 29, 29 are formed, as shown in FIG. 15C. Note that this etching process is continued until the diameter of recess portions 29, 29 is slightly larger than that of the through holes 3b, 3b.

Subsequently, the through holes 3b, 3b and the recess portions 29, 29 are filled with gold 14 through the electroplating having the metallic plate 20 as a common electrode. This filling is made until gold 14 is swollen up to the thickness nearly corresponding to that of the recess portions 29, 29 at the opening end portion for the through holes 3b, 3b on the surface of polyimide resin 27. Note that the filling with the electroplating is not limited to the use of gold (Au), but the metal such as Ag, Cu, Be, Mo, Ni or the alloy thereof may be used.

Figure 15D:
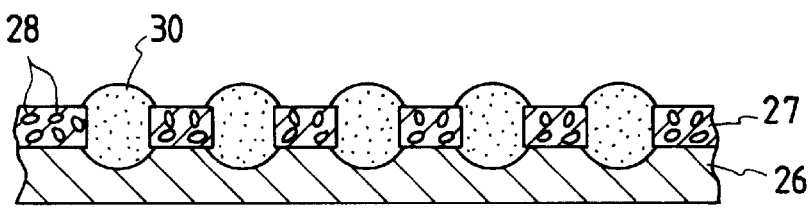
Figure 15E:
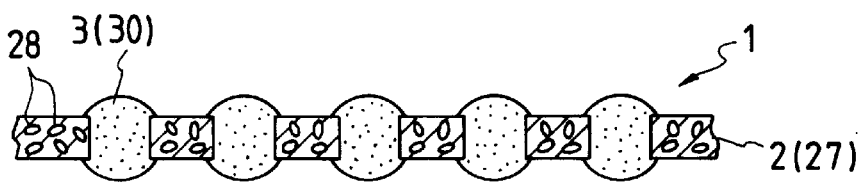

Finally, the metallic plate 20 used for the base is removed with the metallic etching. Thereby, the electrical connecting member 1 according to the present invention can be constituted as shown in FIG. 15E, in which a number of conductive members 3, 3 made of gold are embedded into the carrier 2 made of polyimide resin 27 which is an insulating material and containing an adhesive 20 in the insulating state, their both ends being exposed to the inside and the outside of the carrier 2, respectively.

On the other hand, the fabrication of the electrical connecting member according to a third embodiment of the present invention is performed in the following way. First, the negative photosensitive polyimide resin 27 is coated on the metallic plate 20 which is the base, as shown in FIG. 16A. The coating layer should have a greater thickness than the carrier 2, as previously described.

Subsequently, the surface of the coating layer made of polyimide resin 27 is exposed via the photomask having a predetermined pattern formed, and further developed, so that a number of through holes 3b, 3b penetrating from the inside of the coating layer to the outside are formed. Then, they are heated to cure the coating layer of polyimide resin 27 with the conversion into the imide, the metallic plate 26 located beneath the through holes 3b, 3b is etched with the etching from the surface side of the coating layer to form the recess portions 29, 29, and the through holes 3b, 3b and the recess portions 13, 13 are filled with gold 30 with the electroplating having the metallic plate 20 as the common electrode. The process from the state of FIG. 16A to this state is the same as from FIG. 15B to FIG. 15D in the fabrication of the electrical connecting member 1 according to the previous example, and therefore the figures are omitted.

Then, the metallic plate 26 used for the base is removed with the metallic etching. Thereby, a crude product 1 is constituted as shown in FIG. 16B, in which a number of conductive members 3, 3 made of gold are embedded into the carrier 2 made of polyimide resin which is an insulating material, in the mutually insulating state, and their both ends are exposed to the inside and the outside of the carrier 2. It will be appreciated that this crude product 1 corresponds to a conventional electrical connecting member 1 as shown in FIG. 4.

Then, a resist layer 31 having an adequate thickness is formed only on an exposed portion of each conductive member 3 on the inside and the outside of the carrier 2 for the crude product 1, as shown in FIG. 16C. The formation of such resist layer 31 can be performed in the same procedure as the formation of the through holes 3b, that is, in such a procedure that first, the photosensitive resist agent is coated on the entire surface of the carrier 2, the surface of the coating layer is covered with the photomask having a predetermined pattern formed, exposed via the photomask and then developed, and the unexposed portion is removed, so that the residual portion becomes a resist layer.

Then, an adhesive is applied onto a portion of the inside and the outside of the carrier 2 uncoated with the resist layer 31, as shown in FIG. 16D, and finally the resist layer 15 is peeled off. Thereby, the electrical connecting member 1 according to the third embodiment of the present invention can be obtained as shown in FIG. 16E, in which the adhesive 28 is coated a predetermined thickness on the inside and the outside of the carrier 2 carrying the conductive members 3, 3.

The adhesive 28 coated on the surface of the carrier 2 requires to have the thermosetting property, and may be an adhesive resin such as epoxy, polyester, polyurethan, phenol, resorcinol, urea, or melamine. It is also possible that the coating of the adhesive 28 is made on the entire surface of the carrier 2, and the adhesive applied on the formation portion of the layer 31 is removed at the same time when the resist layer 31 is peeled off after the coating.

FIG. 17 is a typical view showing a connecting form of electric circuit components with the electrical connecting member in this example as obtained in the above-described manner, in which FIG. 17A shows the use of an electrical connecting member 1 in the previous example, and FIG. 17B shows the use of an electrical connecting member 1 in another example.

In the figure, 4, 5 are electric circuit components to be connected, and the electric circuit components 4, 5 are disposed on both front and back faces of the carrier 2, as conventionally performed, and electrodes 6, 7 for use at connection ends are aligned in a plan view. And after the electric circuit components 4, 5 are placed into contact with the both faces of the carrier 2, as shown in FIG. 17A, if the electrical connecting member 1 according to the first embodiment is used, or after the electric circuit components 4, 5 are placed into contact with the coating layer surfaces 28, 28 of the adhesive on both faces of the carrier 2, as shown in FIG. 17B, if the electrical connecting member 1 according to the third embodiment is used, the whole entity is heated.

This heating is applied until the adhesive contained in the carrier 2 or the adhesive 28 applied on the surface of the carrier 2 reaches a curing temperature, whereby the electric circuit components 4, 5 are adhered to the carrier 2 or the coating layer of the adhesive on the surface of the carrier 2, and further, with the curing and shrinkage of the adhesive caused by the heating, the carrier 2 itself in the electrical connecting member 1 of FIG. 17A or the coating layer of the adhesive 20 in the electrical connecting member 1 of FIG. 17B is shrunk, so that the electrodes 6, 7 of the electric circuit components 4, 5 are pressed against the end faces of conductive members 3, 3 located in alignment therewith, with which an excellent metallic junction state can be obtained with this pressing, whereby the electrodes 6, 7, that is, the electric circuit components 4, 5 are connected electrically via the conductive members 3, 3.

In the connecting method as practiced in this way, according to the present invention, the electric circuit components 4, 5 are subjected to the pressure for maintaining the contact with the carrier 2 and the heating for curing the adhesive 28, in which as the curing temperature of the thermosetting adhesive is normally about 100 to 200° C., there is no risk that the electric circuit components 4, 5 and the carrier 2 are damaged due to the heating and the pressure, and as the thermal stress arising in the conductive members 3, 3 is small, it is possible to eliminate the occurrence of conduction failures and the increase in the electrical resistance after the connection.

After the connection, the electric circuit components 4, 5 and the electrical connecting member 1 are connected with a joining force between the electrodes 6, 7 and the conductive members 3, 3, as well as an adhesive force between the whole of electric circuit components 4, 5 and the carrier 2, so that there is an additional advantage that an extreme high bond strength can be obtained.

Next, a stable and secure connecting method for making the connection between electric circuit components using the electrical connecting member will be described below.

Thus, the present inventors made the experiments and studies with efforts for the amount of deformation in the conductive member for obtaining the metallic solid phase diffusion state in a secure manner without incurring the unbonding between the electrical joints of the electric circuit components and the conductive member of the electrical connecting member in order to assure a stable and secure electrical connection using the electrical connecting member, and thus consequently obtained such a view that when the amount of deformation in the conductive member of electrical connecting member (the amount of deformation in view of the diameter of bump) is 17% or more in a condition in which the temperature of the conductive members of the electrical connecting member is from 250 to 400° C., the metallic solid phase diffusion state is obtained in the connection between the conductive members and the electrical joints, and the unbonding may be incurred before the conductive members reach such an amount of deformation.

In the following, an example thereof will be specifically described below with reference to the drawings. FIG. 18 is a typical cross-sectional view showing an electrical connecting member according to the present invention, in which 1 is an electrical connecting member, 2 is a carrier made of an electrical insulating material, and 3 is a conductive member made of for example gold.

The carrier 2 is made of a photosensitive polyimide resin, in which the conductive members 3 made of gold are provided within the holes 3 bored therein. one end of the conductive member 3 is exposed to one face of the carrier 2, and the other end thereof is exposed to the other face of the carrier 2, in the state of slightly protruding from the surface of the carrier 2.

FIG. 19 is a graph showing the relation between the pressure being applied increasingly and the rate of deformation and the rate of junction in the conductive member 3, with the electrical connecting member of FIG. 18 sandwiched between the substrates.

If the pressure applied on the conductive member is below a pressure A, the deformation of the bump is small, in which it will be found that the bump junctions are not all joined, resulting in unjoined conductive member.

The electrical connecting member 1 having the conductive members 3 is pressed between the substrates which are electric circuit components, in which the pitch between conductive members 3 is L, the protruding height of the conductive member 3 from the surface of the carrier 2 is h, the maximum diameter of the conductive member 3 is D, and the diameter of the column portion 3a of the conductive member 3 located within the carrier 2 is r.

The interrelation between the height h of the conductive member 3, the pitch L, the diameter r of the column portion of the conductive member is as follows.

Figure 20:
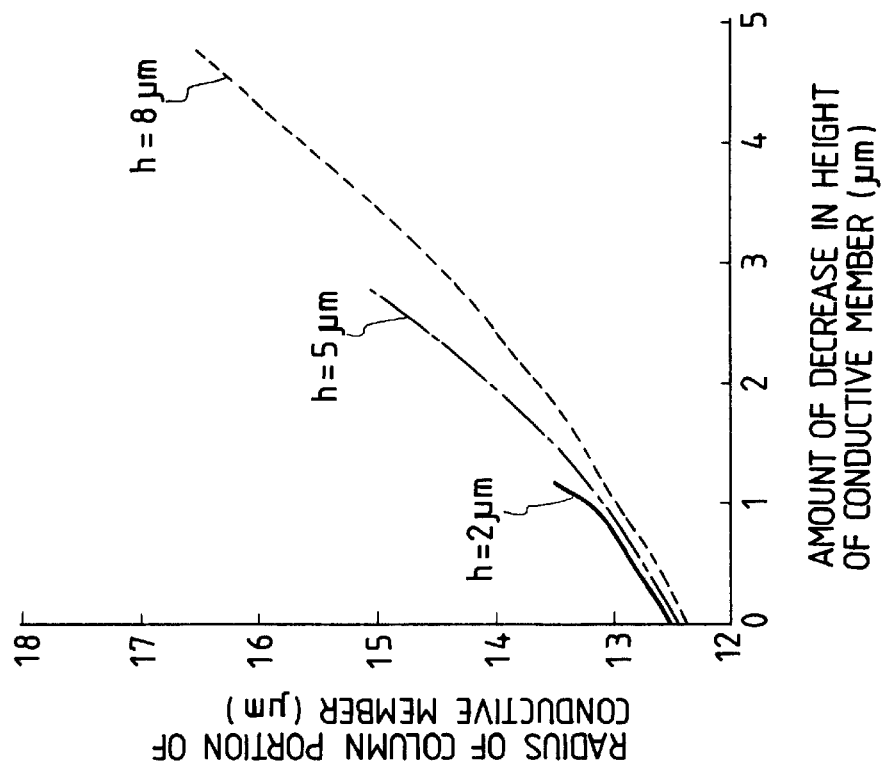
FIG. 20 is a graph showing the relation between the amount of decrease in height and the radius of column portion of conductive member when the height of conductive member is varied with the pitch of conductive member fixed.

FIG. 20 is a graph showing the relation between the amount of decrease in height h from the surface of the carrier and the radius of column portion of conductive member, in which in the graph, the pitch L of conductive member is fixed at 30 $\mu$m, and the height h of conductive member is changed as 2 $\mu$m (solid line), 5 $\mu$m (dashed line) and 8 $\mu$m (broken line). It will be clearly found from the graph that the larger the height h, the greater increase in the radius of column portion when it is pressed and deformed. The increase of column portion can set the height h of conductive member properly because of the corresponding increase in the swelling amount on the carrier 2.

Figure 21:
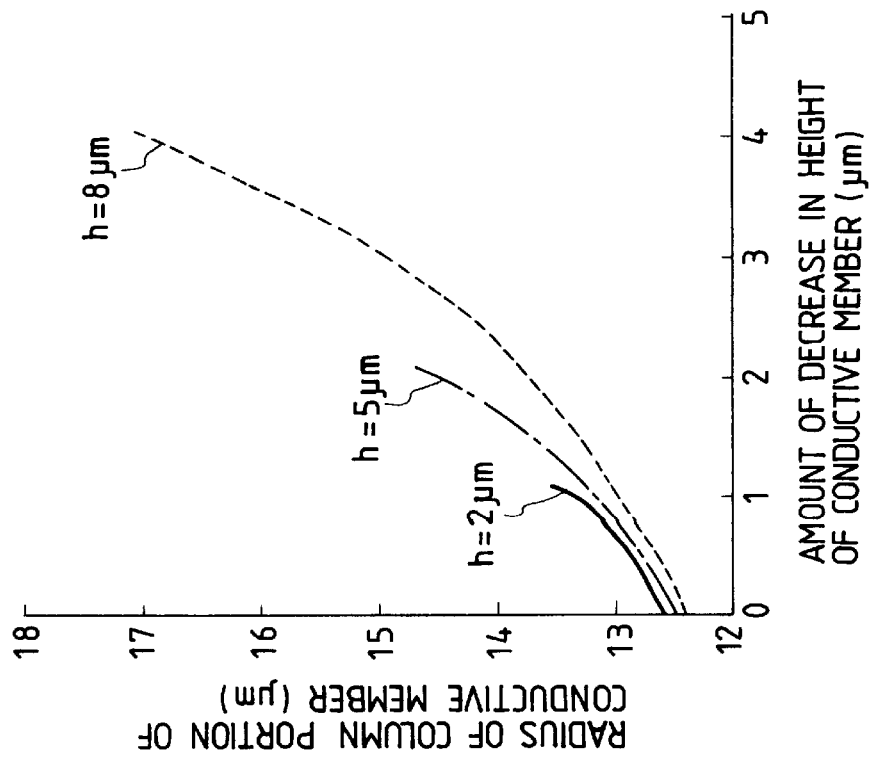
FIG. 21 is a graph showing the relation between the amount of decrease in height and the radius of conductive member when the height of conductive member is varied with the pitch of conductive member fixed.

FIG. 21 is a graph showing the relation between the amount of decrease in height h and the radius of column portion of conductive member, in which the pitch L of conductive member is fixed at 40 $\mu$m, and the height h of conductive member is changed as 2 $\mu$m (solid line), 5 $\mu$m (dashed line) and 8 $\mu$m (broken line).

It will be clearly found from the graph that the larger the height h of the conductive member, the greater increase in the radius of column portion when it is pressed and deformed, as in FIG. 20, but the larger the pitch L of conductive member, the smaller increase in the radius of the column portion, as can be seen from the comparison between FIGS. 20 and 21.

Figure 22:
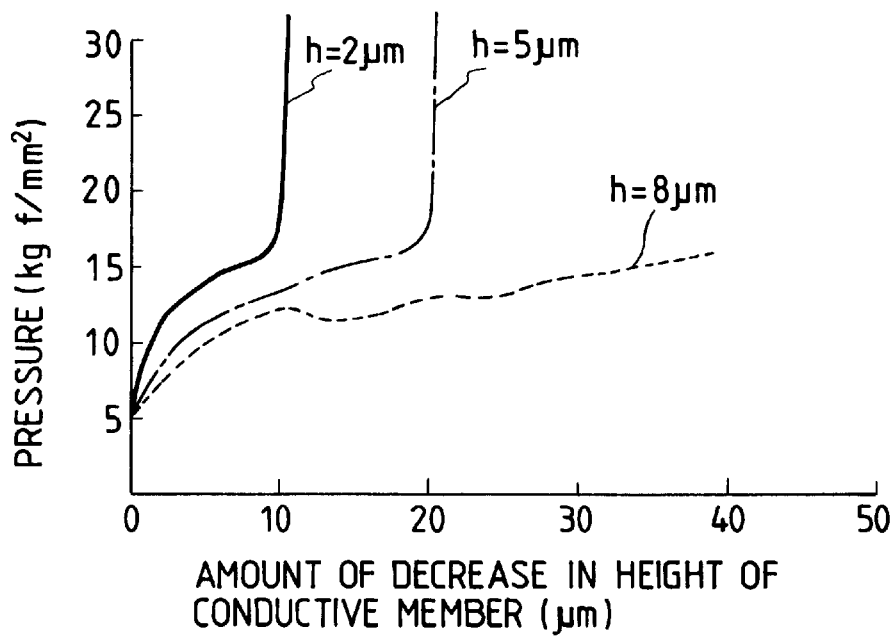
FIG. 22 is a graph showing the relation between the amount of decrease in height and the pressure when the height of conductive member is varied with the pitch of conductive member fixed.
Figure 29:
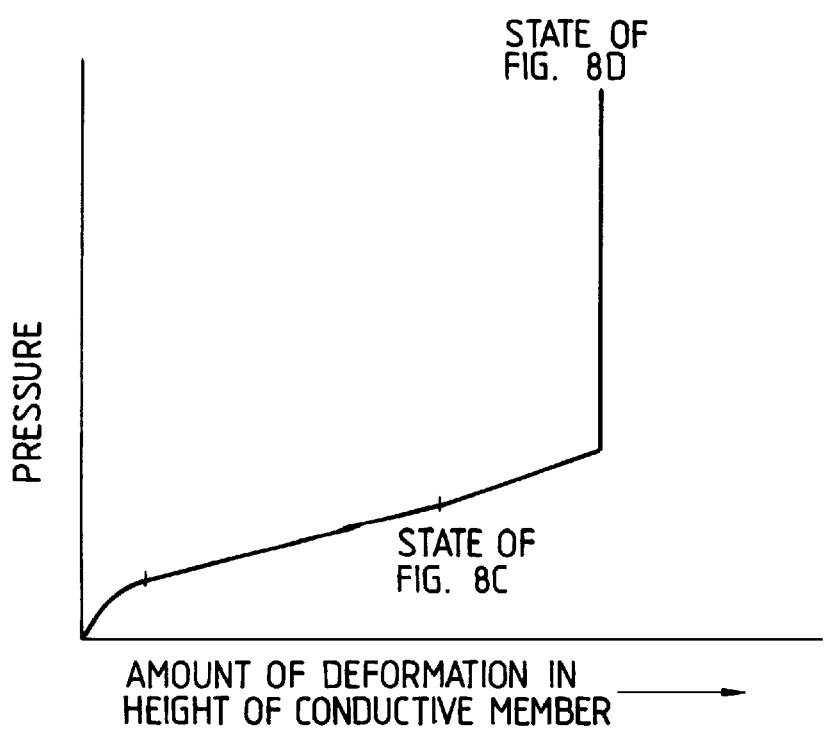
FIG. 29 is a graph showing the relation between the amount of deformation in height of conductive member and the pressure against the electric circuit component.

FIG. 22 is a graph showing the relation between the amount of decrease in height h and the pressure (Kgf/mm$^2$)

required for the compression bonding, in which the pitch L of conductive member is fixed at 30 μm, and the height h of conductive member is changed as 2 μm (solid line), 5 μm (dashed line) and 8 μm (broken line). It will be clearly found from the graph that when the height h of the conductive member is small, the deformation reaches a limit with a slight decrease of the height h, requiring some wasteful pressure.

Figure 23A:
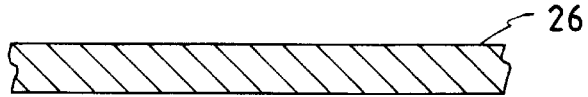
FIGS. 23A–23F are views showing a main manufacturing process of an electrical connecting member according to the present invention.
Figure 23B:
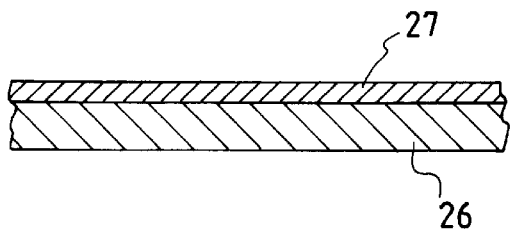
Figure 23C:
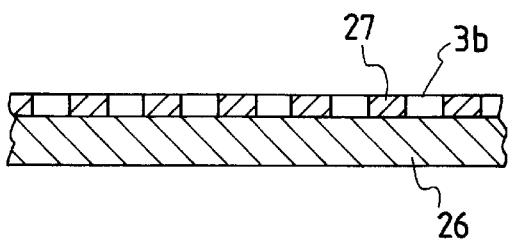
Figure 23D:
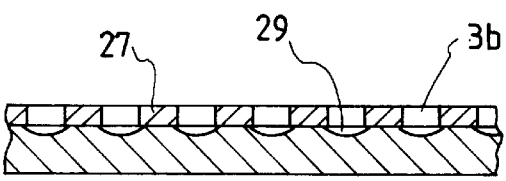

FIG. 23 is a typical cross-sectional view showing a principal process of the fabrication method for the electrical connecting member according to the present invention, in which first, a metallic sheet 26 which is a base is prepared (FIG. 23A), and a negative-type photosensitive resin is applied on this metallic sheet 26 with a spinner for the prebake (FIG. 23B). The photosensitive resin 27 is irradiated and exposed via a photomask (not shown) having a predetermined pattern, and then developed (FIG. 23C). Thereby, the photosensitive resin 27 remains on the exposed portion, while the photosensitive resin 27 is removed from the unexposed portion with the processing, so that holes 3b through which the surface of metallic sheet is exposed are formed on the bottom. After the the photosensitive resin is cured with the rise in the temperature, it is dipped in an etching liquid to allow the etching for the surface of metallic sheet 11 exposed within the holes 3b, and form the recess portions (FIG. 23D).

Figure 23E:
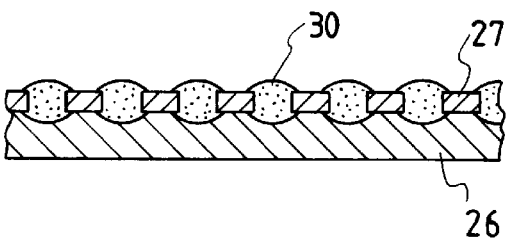
Figure 23F:
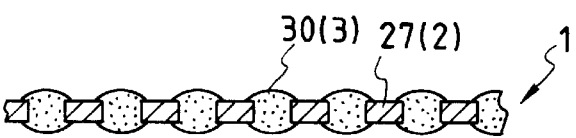
Figure 24:
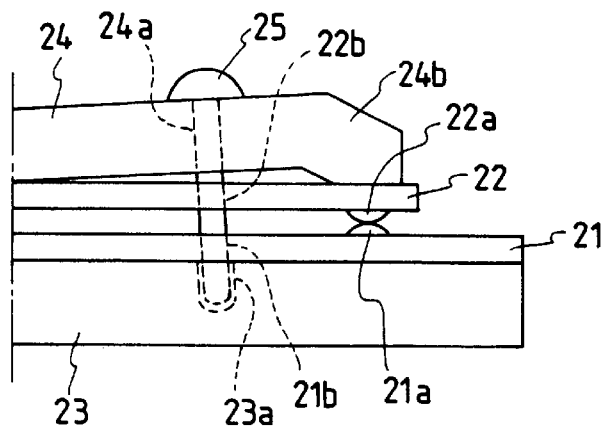
FIG. 24 is a typical view showing a connecting method in the background art.
Figure 25A:
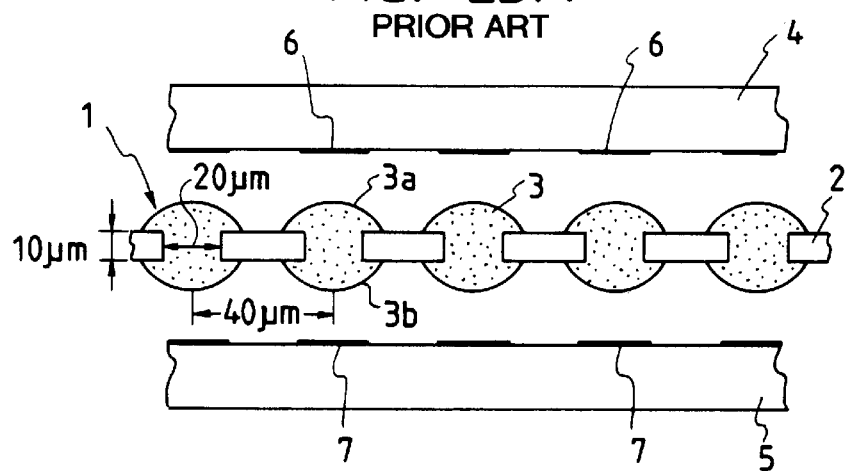
FIGS. 25A and 25B are explanation views showing the connecting form between typical electric circuit components and an electrical connecting member.
Figure 25B:
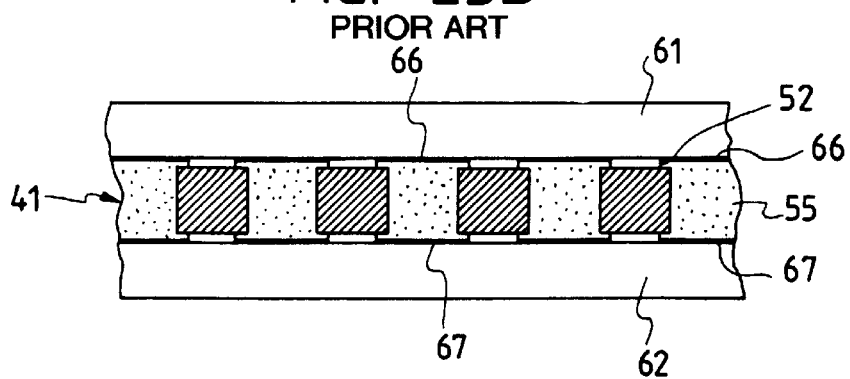
Figure 26:
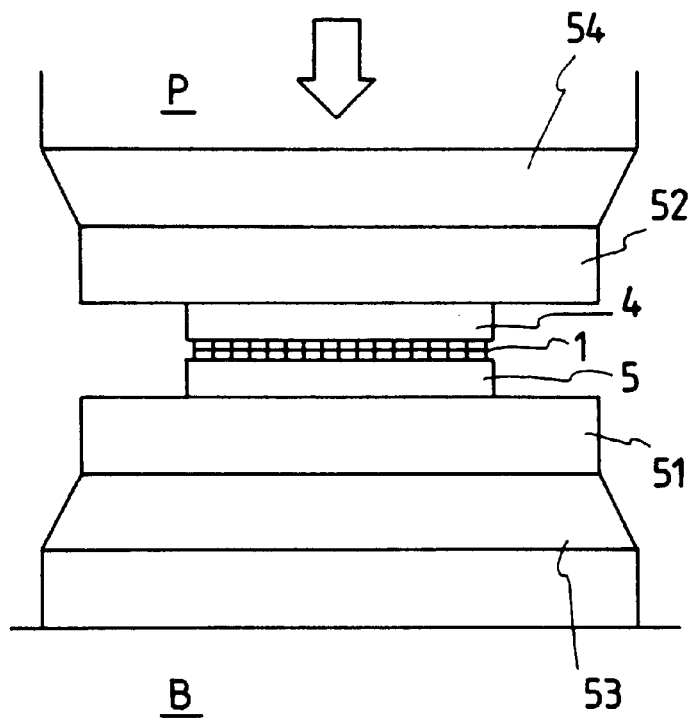
FIG. 26 is a typical view showing a thermocompression bonding apparatus in the background art.
Figure 27:
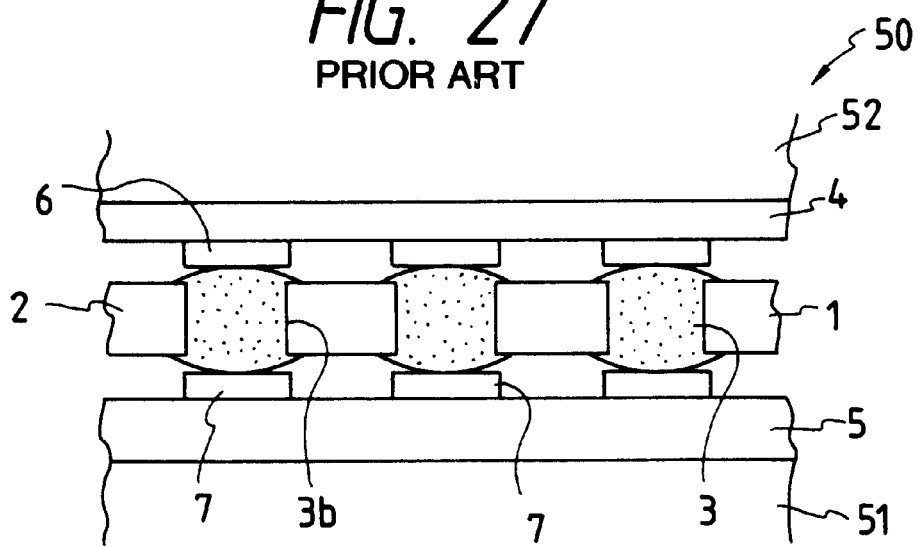
FIG. 27 is a typical view showing an example of the connection using the apparatus of FIG. 26.
Figure 28A:
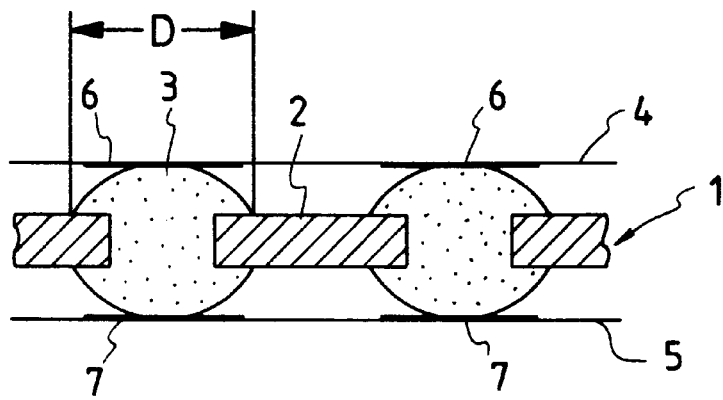
FIGS. 28A–28D are typical cross-sectional views showing a process for the compression bonding between an electrical connecting member and printed boards which are electric circuit components.
Figure 28B:
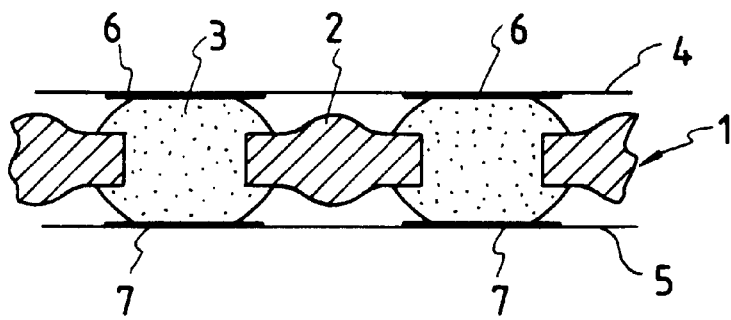
Figure 28C:
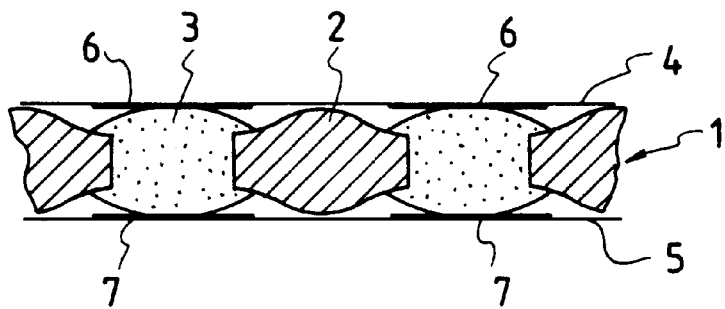
Figure 28D:
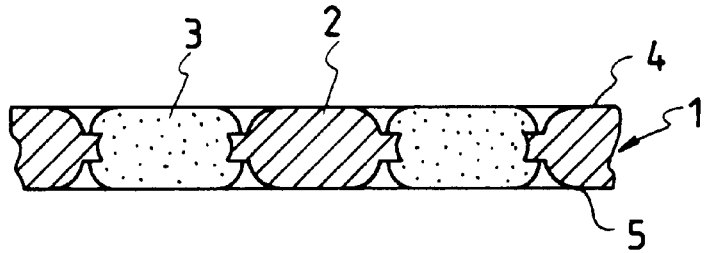

Subsequently, the holes 3b and the recess portions 29 are filled with gold 30, and the gold plating is applied to be swollen a predetermined amount above the surface of photosensitive resin 27, so that the conductive members 3 are formed (FIG. 23E). Finally, the metallic sheet 27 is removed with the etching, so that the electrical connecting member 1 constituted of the conductive members 3 made of gold and the carrier 2 made of the photosensitive resin 27 respectively can be fabricated, as shown in FIG. 23F.

The experimental results for the relation between the pitch L of conductive member and the protruding height h of conductive member from the surface of the carrier are shown in Table 1.

TABLE 1

| Size conditions for conductive member | | | Detected Data | | | |
|---|---|---|---|---|---|---|
| Height (μm) | Max. diameter (μm) | Pitch (μm) | Max. diameter after junction (μm) | Rate of junction % | Required pressure Kgf/cm² | Integrated evaluation |
| 2 | 16 | 30 | 21 | 30 | 70 | x |
| | | 40 | 21 | 40 | 60 | x |
| | | 50 | 21 | 50 | 50 | x |
| | | 60 | 21 | 60 | 40 | x |
| 3 | 19 | 30 | 25 | 50 | 60 | x |
| | | 40 | 25 | 60 | 50 | x |
| | | 50 | 25 | 70 | 40 | x |
| | | 60 | 25 | 80 | 30 | x |
| 4 | 22 | 30 | Not joined | — | — | x |
| | | 40 | 29 | 90 | 30 | Δ |
| | | 50 | 29 | 100 | 20 | o |
| | | 60 | 29 | 100 | 20 | o |
| 5 | 25 | 30 | Not joined | — | — | x |
| | | 40 | 32 | 100 | 20 | o |
| | | 50 | 32 | 100 | 20 | o |
| | | 60 | 32 | 100 | 20 | o |
| 6 | 28 | 30 | Not joined | — | — | x |
| | | 40 | 36 | 90 | 30 | Δ |
| | | 50 | 36 | 100 | 20 | o |
| | | 60 | 36 | 100 | 20 | o |
| 7 | 31 | 30 | Not joined | — | — | x |
| | | 40 | Not joined | — | — | x |
| | | 50 | 40 | 80 | 40 | Δ |
| | | 60 | 40 | 90 | 30 | Δ |
| 8 | 34 | 30 | Not joined | — | — | x |
| | | 40 | Not joined | — | 70 | x |
| | | 50 | 44 | 70 | 60 | x |
| | | 60 | 44 | 80 | 50 | x |

Table 1 shows the results in which the heating compression bonding is made by changing the height h of conductive member from the carrier, the maximum diameter R of conductive member, and the pitch L of conductive member, respectively, with a target of 100% compression bonding between the conductive members and the electrical joints of the substate, the compression bonding ratio (the ratio % of the number of compression bonded conductive members to the total number of conductive members) and the pressure (Kgf/mm²) under the heating was obtained in respective cases, and the integrated evaluation was made. Note that in the integrated evaluation, the sign o indicates the compression bonding ratio of 100%, the sign Δ indicates the compression bonding ratio of 80% or greater, and the sign x indicates the compression bonding ratio below 80%.

As above described, with the method of the above-described example, an elastic member is used in the compression bonding between a plurality of electrical joints, and may be suitable for the multipoint joints particularly on a long substrate, from an intermediate point in the electrical connecting area, allowing for the application of a uniform bonding load to each electrical joint, whereby the compression bonding structure is simplified, and as elastic member for the protection are interposed between the previously-described elastic member and the electric circuit components, it is possible to make the compression bonding load more uniform by absorbing minute irregularities on the elastic member such as a leaf spring or the electric circuit components themselves. Moreover, since the compression bonding is made between elastic members producing the biasing force, a further uniform bonding load can be applied, whereby the method of the present invention can exhibit the excellent effects.

With the method in another example, since the connection between electrical joints of the electric circuit components is made using the magnetic force of magnet, it is possible to make and maintain the contact of electrical joints with a uniform pressure, so that the compression bonding structure is simplified, and as the magnet may be an electromagnet, it is possible to separate the electrical joints from each other as required.

With the connecting apparatus and its method in this example, the electric circuit components, laid one on the other, with the electrical connecting member carried therebetween, are pressed gradually on a part thereof in succession to make the compression bonding for all of the electrical joints, so that there is a less influence from the mechanical error, thermal distortion error and secular change, and a higher accuracy can be obtained in the compression bonding as compared with the collective bonding, with a less dispersion of the characteristics, because of a higher operation efficiency and a more uniform bonding load as compared with the single point junction.

Moreover, the electrical connecting member according to the present invention is such that the carrier carrying conductive members embedded contains a thermosetting adhesive or has a coating layer of thermosetting adhesive on its surface, and the connecting method of electric circuit components using the electrical connecting member according to the present invention is one in which the electric circuit components to be connected are laid on both sides of the carrier and then heated, and with the shrinkage of the carrier itself or the coating layer due to the curing of the adhesive, the electric circuit components are pressed against the conductive members, in which as the pressure for maintaining the contact and the heating for attaining the curing temperature of adhesive are only required, no special apparatus is necessary, and there is no risk that the pressure and the heating may damage the electric circuit components and the electrical connecting member, so that an excellent connecting state can be obtained between two components, with a decreased thermal stress in the conductive members, whereby excellent effects can be exhibited such as effective prevention of the occurrence of conduction failures and the increase in the electrical resistance after the connection, and the easy connection between electric circuit components inferior in the thermal resistivity such as a liquid crystal substrate.

Further, in the present invention, since the pitch of conductive member provided on the carrier and the protruding height of conductive member from the surface of the carrier are set so that the amount of deformation in the conductive member may reach 17% or greater, it is possible to make a secure compression bonding between the conductive members and the electrical joints of electric circuit components in the metallic solid phase diffused junction state, thereby enabling the uniform compression bonding at a lower pressure.

What is claimed is:

1. A method for electrical connection between electrical joints of electric circuit components via an electrical connecting member having a plurality of conductive members carried on a carrier in a mutually insulating state, one end of each said conductive member being exposed to one face of said carrier and the other end of said each conductive member being exposed to the other face of said carrier, including:

deforming said each conductive member by successively compressing portions of said electric circuit components with said electrical connecting member sandwiched therebetween so that a deformation ratio of the diameter of the portion of said each conductive member exposed from a face of said carrier is equal to or more than 17%, where the deformation ratio is an increase in conductive member diameter as a percentage of said diameter before compression, to make a thermocompression bond between each electrical circuit component and the conductive members of said electrical connecting member by applying heat to the successively compressed portion of said electrical circuit component, said compression securely causing a metal diffusion in the electrical circuit components and the conductive members to join the electrical circuit components and the conductive members.

2. A method according to claim 1, wherein said conductive members are made of gold.

3. A method for electrical connection according to claim 1, wherein in said compressing step, the conductive member is heated to 250–400° C.

4. A method according to claim 1, wherein said heat applying step for applying heat to a partially compressed portion of said electrical circuit component is performed at a temperature of from 250 degrees celsius to 400 degrees celsius during the thermocompression bonding.

* * * * *

UNITED STATES PATENT AND TRADEMARK OFFICE
CERTIFICATE OF CORRECTION

PATENT NO.   :  6,015,081

DATED        :  January 18, 2000

INVENTOR(S)  :  TAKAHIRO OKABAYASHI, ET AL.

It is certified that error appears in the above-identified patent and that said Letters Patent is hereby corrected as shown below:

ON THE COVER PAGE
[56] U.S. PATENT DOCUMENTS:
    "3,973,766 8/1976 Fontrielle" should read --3,972,766 8/1976 Fontvieille--; and
    "4,926,549 5/1990 Yohizawa et al." should read --4,926,549 5/1990 Yoshizawa et al.--.

[56] FOREIGN PATENT DOCUMENTS:
    "1044095" should read --1-044095--;
    "1316674" should read --1-316674--;
    "0249385" should read --2-49385; and
    "61166876" should read --61-166876--.

[56] OTHER PUBLICATIONS:
    After L.S. Goldmann, "Inter-coonections", should read --Inter-connections",--.

UNITED STATES PATENT AND TRADEMARK OFFICE
CERTIFICATE OF CORRECTION

PATENT NO.   :   6,015,081

DATED        :   January 18, 2000

INVENTOR(S) :   TAKAHIRO OKABAYASHI, ET AL.

It is certified that error appears in the above-identified patent and that said Letters Patent is hereby corrected as shown below:

COLUMN 1
Line 29, "for" should read --for the--.

COLUMN 2
Line 52, "shown" should read --shown in--.

COLUMN 3
Line 34, "ends" should read --shown in--.

COLUMN 4
Line 20, "joint" should read --joint,--.

COLUMN 7
Line 8, "times" should read --time--.

UNITED STATES PATENT AND TRADEMARK OFFICE
CERTIFICATE OF CORRECTION

PATENT NO. : 6,015,081

DATED : January 18, 2000

INVENTOR(S) : TAKAHIRO OKABAYASHI, ET AL.

It is certified that error appears in the above-identified patent and that said Letters Patent is hereby corrected as shown below:

COLUMN 8
Line 61, "FIGS." should read --figure,--; and
Line 64, "8" should read --5--.

COLUMN 9
Line 67, "150 kg/mm," should read --150 kg/mm$^2$,".

COLUMN 10
Line 5, "the" should be deleted;
Line 6, "substantial" should read --substantially the--;
Line 8, "it" should read --its--; and
Line 28, "partial" should read --partially--.

COLUMN 12
Line 37, "other" should read --the other--; and
Line 67, "partial" should read --partially--.

UNITED STATES PATENT AND TRADEMARK OFFICE
CERTIFICATE OF CORRECTION

PATENT NO.   :   6,015,081

DATED        :   January 18, 2000

INVENTOR(S) :   TAKAHIRO OKABAYASHI, ET AL.

It is certified that error appears in the above-identified patent and that said Letters Patent is hereby corrected as shown below:

COLUMN 13
Line 32, "FIG. 12" should read --FIG. 13--; and
Line 35, "strut 22" should read --strut 12--.

COLUMN 14
Line 29, "is" should be deleted.

COLUMN 15
Line 5, "with" should be deleted;
Line 6, "respect to FIG 14." should be deleted;
Line 33, "to" should be deleted; and
Line 34, "have" should be deleted.

COLUMN 16
Line 58, "to have" should be deleted.

UNITED STATES PATENT AND TRADEMARK OFFICE
CERTIFICATE OF CORRECTION

PATENT NO. : 6,015,081

DATED : January 18, 2000

INVENTOR(S) : TAKAHIRO OKABAYASHI, ET AL.

It is certified that error appears in the above-identified patent and that said Letters Patent is hereby corrected as shown below:

COLUMN 19
Line 22, "the" (second occurrence) should be deleted.

COLUMN 20
Line 24, "substate" should read --substrate--; and
Line 64, "a" should be deleted.

COLUMN 21
Line 1, "a" should be deleted.

Signed and Sealed this

Tenth Day of April, 2001

Attest:

NICHOLAS P. GODICI

*Attesting Officer*  *Acting Director of the United States Patent and Trademark Office*